(12) United States Patent
Clark

(10) Patent No.: US 7,225,674 B2
(45) Date of Patent: Jun. 5, 2007

(54) SELF-STABILIZING, FLOATING MICROELECTROMECHANICAL DEVICE

(75) Inventor: Jason Vaughn Clark, San Pablo, CA (US)

(73) Assignee: The Regents of the University of California, Oakland, CA (US)

(*) Notice: Subject to any disclaimer, the term of this patent is extended or adjusted under 35 U.S.C. 154(b) by 34 days.

(21) Appl. No.: 10/836,562

(22) Filed: Apr. 30, 2004

(65) Prior Publication Data

US 2005/0241394 A1   Nov. 3, 2005

(51) Int. Cl.
*G01P 15/125* (2006.01)
(52) U.S. Cl. .................. 73/514.32; 73/514.18
(58) Field of Classification Search ............ 73/514.01, 73/514.18, 514.25, 514.32; 310/309
See application file for complete search history.

(56) References Cited

U.S. PATENT DOCUMENTS

| | | | | |
|---|---|---|---|---|
| 3,221,563 A * | 12/1965 | Wing | ................ | 73/514.06 |
| 4,521,854 A | 6/1985 | Rhim et al. | ................ | 364/400 |
| 5,015,906 A | 5/1991 | Cho et al. | ................ | 310/309 |
| 5,187,399 A | 2/1993 | Carr et al. | ................ | 310/40 MM |
| 5,206,504 A | 4/1993 | Sridharan | ................ | 250/251 |
| 5,353,656 A | 10/1994 | Hawkey et al. | ................ | 74/5.41 |
| 5,466,980 A * | 11/1995 | Potter | ................ | 310/309 |
| 5,801,309 A | 9/1998 | Carr et al. | ................ | 73/514.29 |
| 5,969,848 A | 10/1999 | Lee et al. | ................ | 359/298 |
| 5,992,233 A | 11/1999 | Clark | ................ | 73/514.35 |
| 6,067,858 A | 5/2000 | Clark et al. | ................ | 73/504.16 |
| 6,250,156 B1 | 6/2001 | Seshia et al. | ................ | 73/504.12 |
| 6,296,779 B1 | 10/2001 | Clark et al. | ................ | 216/66 |
| 6,507,138 B1 | 1/2003 | Rodgers et al. | ................ | 310/309 |
| 6,679,118 B1 * | 1/2004 | Esashi et al. | ................ | 73/514.32 |
| 6,841,917 B2 * | 1/2005 | Potter | ................ | 310/309 |

(Continued)

FOREIGN PATENT DOCUMENTS

JP       02228263 A  *  9/1990

OTHER PUBLICATIONS

MEMS Technology [online], [retrieved on Apr. 4, 2004], Retrieved from the website of Analog Devices using Internet <URL:http://www.analog.com>. 15 pages.

(Continued)

*Primary Examiner*—John E. Chapman
(74) *Attorney, Agent, or Firm*—Michaelson & Associates; Peter L. Michaelson; George Wolken, Jr.

(57) ABSTRACT

The present invention relates to MicroElectroMechanical Systems (MEMS), devices and applications thereof in which a proof mass is caused to levitate by electrostatic repulsion. Configurations of electrodes are described that result in self-stabilized floating of the proof mass. The electrical properties of the electrodes causing floating, such as currents and/or voltages, typically change in response to environmental perturbations affecting the proof mass. Measuring such currents and/or voltages allow immediate and accurate measurements to be performed related to those perturbations affecting the location and/or the orientation of the proof mass. Additional sensing electrodes can be included to further enhance sensing capabilities. Drive electrodes can also be included that allow forces to be applied to the charged proof mass resulting in a floating, electrically controllable MEMS device. Several applications are described including accelerometers, inertial sensors, resonators and filters for communication devices, gyros, one and two axis mirrors and scanners, among other devices. Several fabrication methods are also described.

7 Claims, 21 Drawing Sheets

U.S. PATENT DOCUMENTS

| | | | |
|---|---|---|---|
| 2002/0093251 A1 | 7/2002 | Hoen | 310/12 |
| 2002/0187618 A1 | 12/2002 | Potter | 438/455 |

OTHER PUBLICATIONS

Hybrid Acoustic/Electrostatic Levitation Apparatus. Conditions for experiments on growth of crystals, cells, and tissues can be highly controlled. [online], [retrieved on Apr. 4, 2004], Retrieved from the website of the National Aeronautics and Space Administratation of the US government using Internet <URL:http://www.nasatech.com/Briefs/Mar99/NPO20165.html>. 3 pages.

It Floats. New MSFC tool levitates molten materials. [online], [retrieved on Apr. 4, 2004], Retrieved from the website of the National Aeronautics and Space Administration of the US government using Internet <URL:http://scienct.nasa.gov/newhome/headlines/msad09mar98_1.html>. 4 pages.

Modelling, Design and Fabrication of Electrostatically Levitated Disk for Internal Sensing Apparatus. [online], [retrieved on Apr. 4, 2004], Retrieved from the website of the Microelectronics Group, Department of Electronics and Computer Science, The University of Southampton using Internet <URL:http://www.mcro.ecs.soton.ac.uk/activities/mems/levidisk/>. 5 pages.

Ultra-Sensitive Acceleromtery for Space Applications. Presentation [online], [retrieved on Apr. 4, 2004], Retrieved from the website of the The French Aeronautics and Space Research Center (Office National d'Etudes et de Recherches Aérospatiales—ONERA) Physics, Instrumentation and Sensing Department (Département Mesures Physiques—DMPH) using Internet <URL:file://C:\DOCUME~1/ADMINI~LOCALS~1\Temp\G4YTF70X.htm>. 1 page.

Ultra-Sensitive Acceleromtery for Space Applications. Theory of Operation [online], [retrieved on Apr. 4, 2004], Retrieved from the website of the The French Aeronautics and Space Research Center (Office National d'Etudes et de Recherches Aérospatiales—ONERA) Physics, Instrumentation and Sensing Department (Département Mesures Physiques—DMPH) using Internet <URL:http://www.onera.fr/dmph-en/accelerometre/principe.html>. 1 page.

Ultra-Sensitive Acceleromtery for Space Applications. Applications [online], [retrieved on Apr. 4, 2004], Retrieved from the website of the The French Aeronautics and Space Research Center (Office National d'Etudes et de Recherches Aérospatiales—ONERA) Physics, Instrumentation and Sensing Department (Département Mesures Physiques—DMPH) using Internet <URL:http://www.onera.fr/dmph-en/accelerometre/applications.html>. 1 page.

Ultra-Sensitive Acceleromtery for Space Applications. Microgravity [online], [retrieved on Apr. 4, 2004], Retrieved from the website of the The French Aeronautics and Space Research Center (Office National d'Etudes et de Recherches Aérospatiales—ONERA) Physics, Instrumentation and Sensing Department (Département Mesures Physiques—DMPH) using Internet <URL:http://www.onera.fr/dmph-en/accelerometre/microgravite.html>. 1 page.

Ultra-Sensitive Acceleromtery for Space Applications, Gravity Field [online], [retrieved on Apr. 4, 2004], Retrieved from the website of the The French Aeronautics and Space Research Center (Office National d'Etudes et de Recherches Aérospatiales—ONERA) Physics, Instrumentation and Sensing Department (Département Mesures Physiques—DMPH) using Internet <URL: http://www.onera.fr/dmph-en/accelerometre/champ-grav.html>. 2 pages.

Ultra-Sensitive Acceleromtery for Space Applications. Fundamental :Physics [online], [retrieved on Apr. 4, 2004], Retrieved from the website of the The French Aeronautics and Space Research Center (Office National d'Etudes et de Recherches Aérospatiales—ONERA) Physics, Instrumentation and Sensing Department (Département Mesures Physiques—DMPH) using Internet <URL:http://www.onera.fr/dmph-en/accelerometre/phys-fond.html>. 2 pages.

"Imagine Manufacturing Micromachines Directly from CAD in Days, Not Months", downloaded from http://www.microfabrica.com/technology on Apr. 22, 2004, 1 page.

"How EFAB™ Technology Works", downloaded from http://www.microfabrica.com/technolgy/EFAB_works.htm on Apr. 22, 2004, 3 pages.

"3D Integration & Electronic Packaging: Overview", downloaded from http://www.mcnc.org/rdi/index.cfm?fuseaction=page&filename=3d_integration_and_electronic_packaging on Apr. 22, 2004, 2 pages.

D. Koester et al, "PolyMUMPs Design Handbook" downloaded from http://www.memscap.com/memsrus/docs/polymumps.dr.v10.pdf on Apr. 26, 2004, 43 pages.

\* cited by examiner

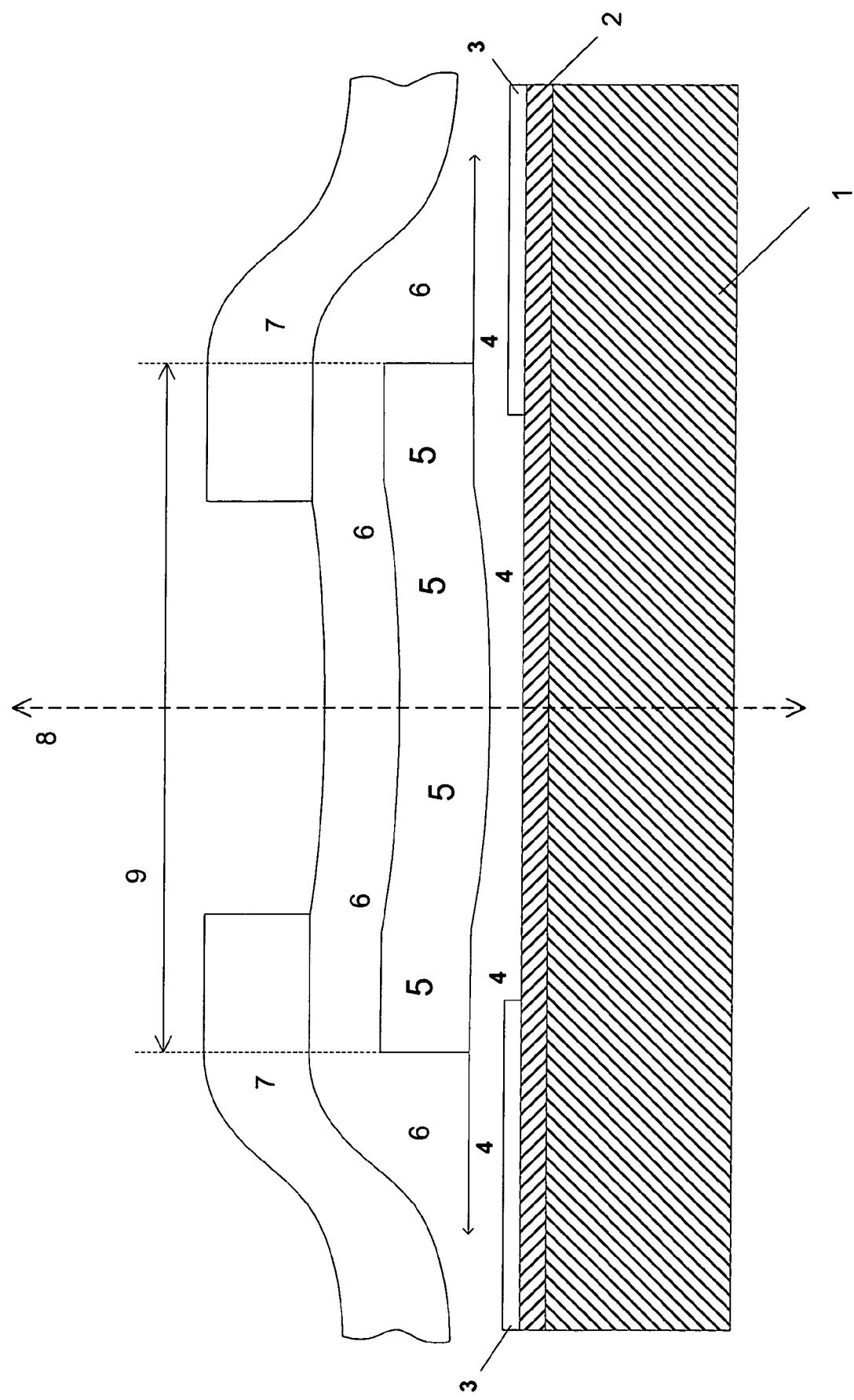

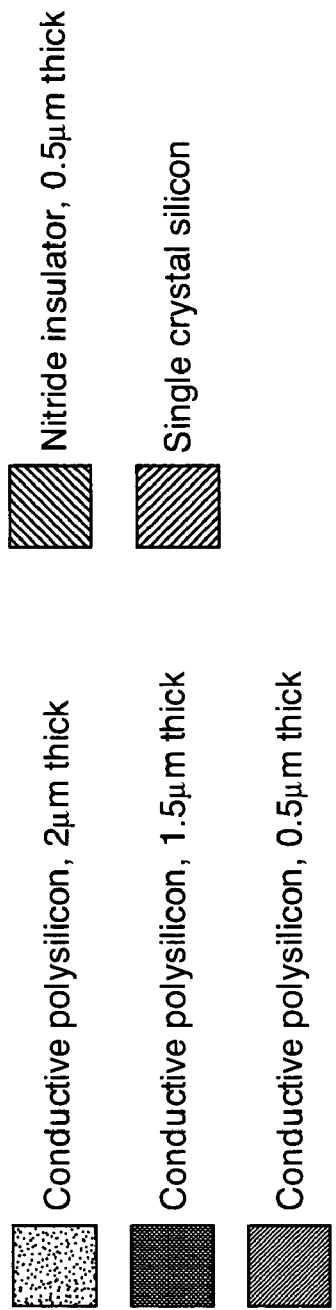
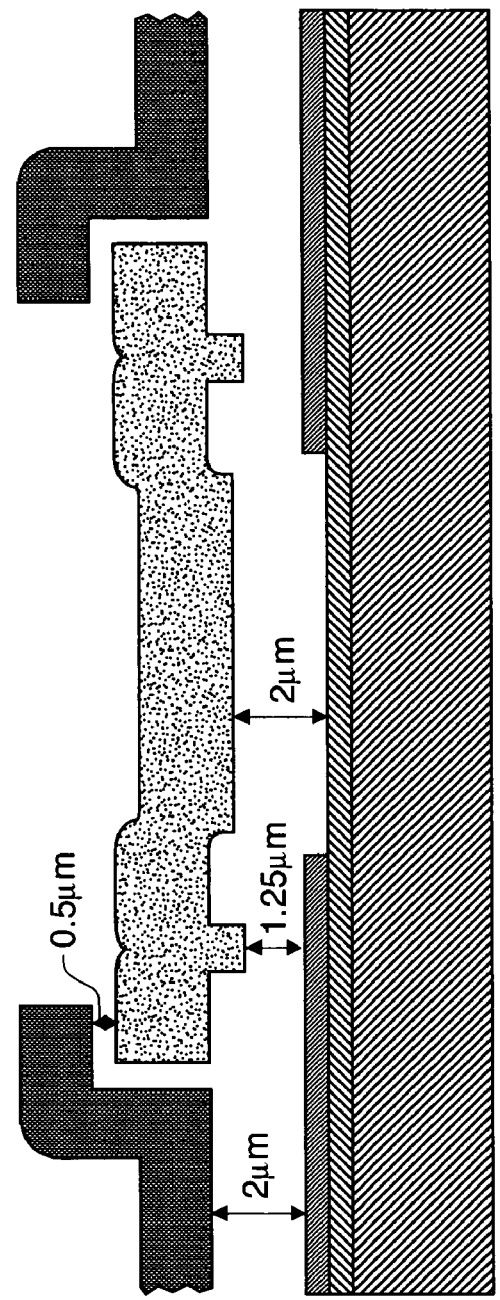
Fig. 1c
numerical values are approximate numerical values are approximate

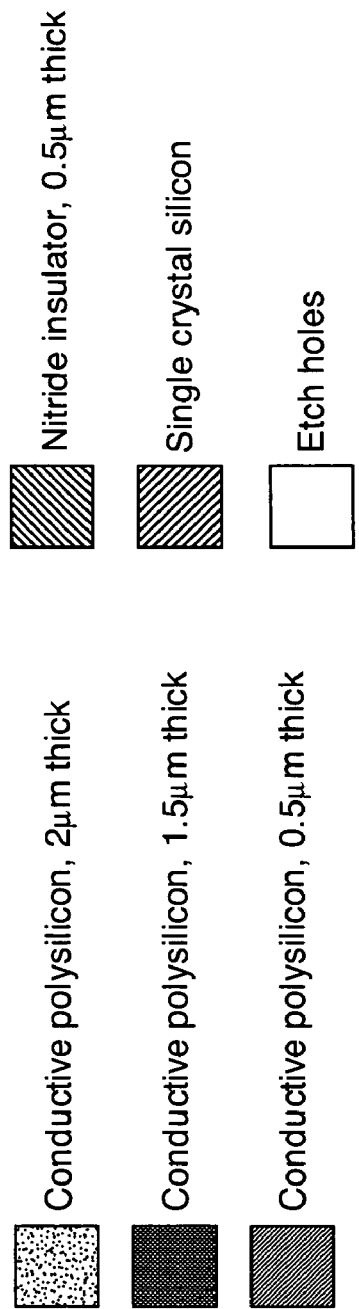
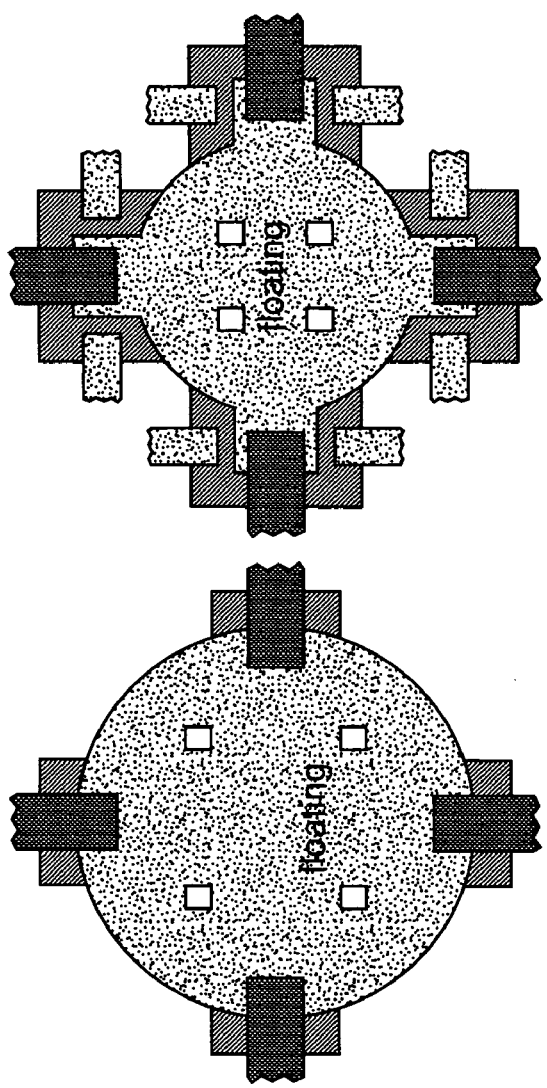
Fig. 1e
numerical values are approximate

Electrification by induction:
A neutral sphere is attracted to a charged sphere.

Attraction by induction:
Charges redistribute on spheres.

Electrification by conduction:
Charges exchange upon contact.

(d)

Electrification by conduction:
Spheres become like-charged.

(e)

Repulsion by induction:
Like-charge spheres repel.

(f)

Electrification by induction:
Charges redistribute.

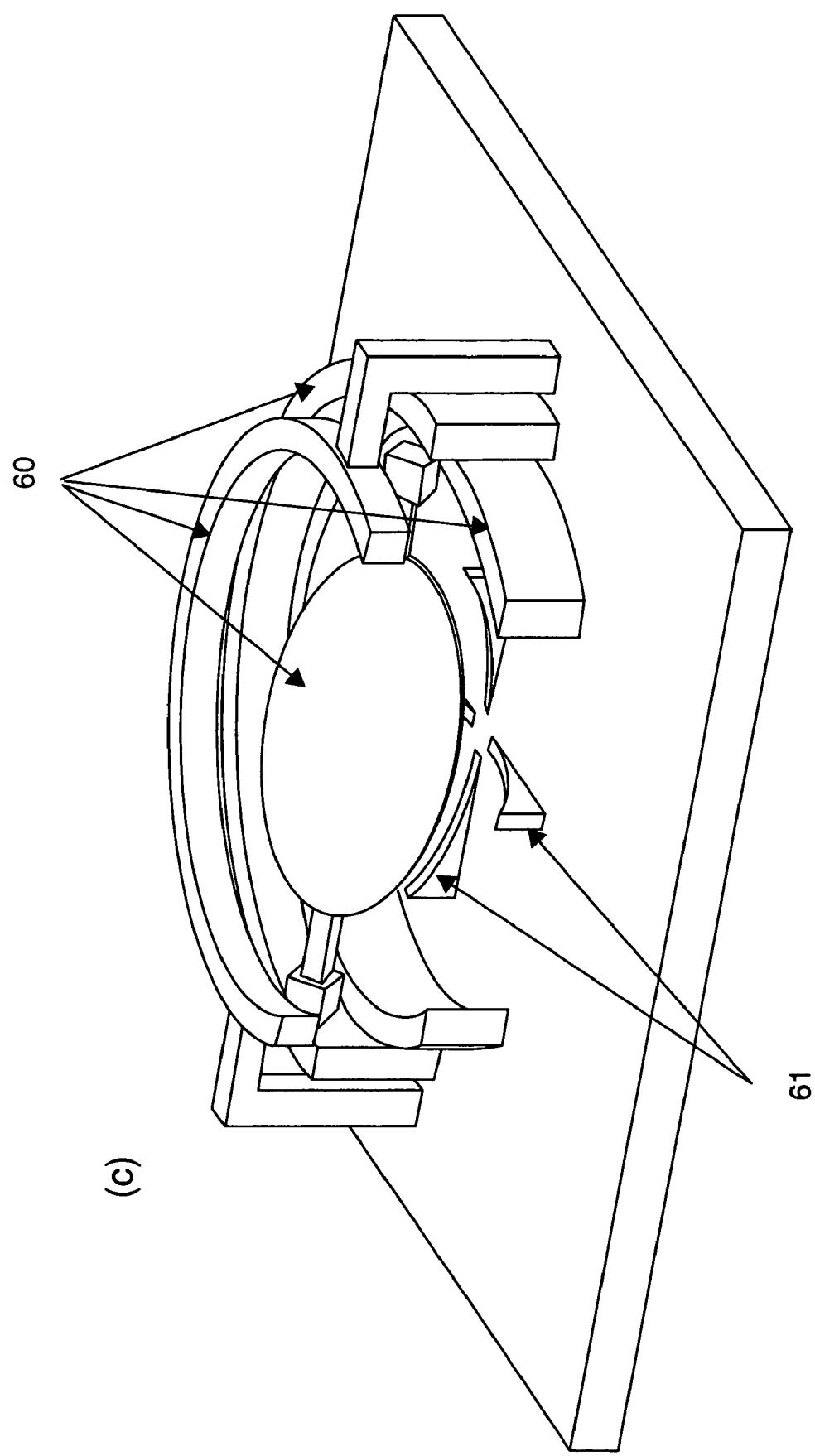

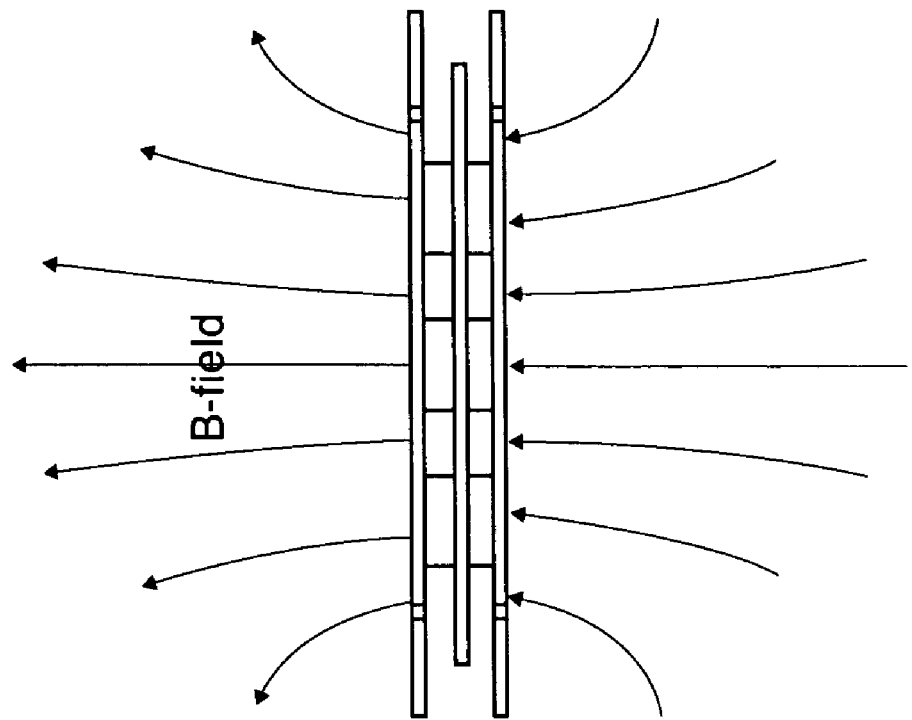
Fig. 8b side view
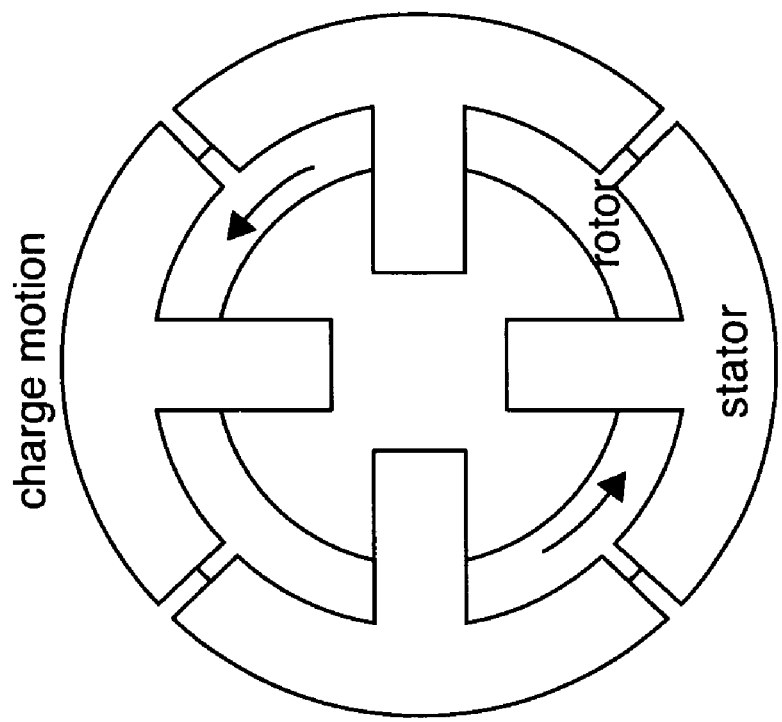
Fig. 8a top view

SELF-STABILIZING, FLOATING MICROELECTROMECHANICAL DEVICE

CROSS REFERENCE TO RELATED APPLICATIONS (none).

STATEMENT REGARDING FEDERALLY SPONSORED RESEARCH OR DEVELOPMENT (none).

BACKGROUND OF THE INVENTION

1. Field of Invention

This invention relates generally to the field of microelectromechanical (MEMS) devices and, in particular, to floating MEMS devices in which a proof mass is electrostatically levitated.

2. Description of the Prior Art

Microelectromechanical (MEMS) devices are finding ever-increasing areas of application in the modern economy as trends towards miniaturization, portability, lightweight, low power consumption and low cost drive many technologies. Sensors, actuators and many other devices are all affected by the wider application of microtechnology and MEMS fabrication techniques.

The present invention relates to a floating MEMS device (FLEMS) in which a proof mass is levitated electrostatically as part of a MEMS device, without the need for feedback control means and, once levitated, without mechanical contact between the proof mass and any other portion of the device.

This non-contact floating MEMS device of the present invention should be contrasted to prior MEMS devices, particularly accelerometers, in which acceleration is typically sensed by deflection of a proof mass mechanically coupled to the device. Examples include U.S. Pat. Nos. 5,969,848; 5,992,233; 6,067,858; 6,296,779 and 6,250,779.

Electrostatic levitation has been used in a variety of non-MEMS fields of application including non-contact materials processing, acceleration or inertial sensors, and other applications. However, these devices typically require complex means to control and stabilize the position of the proof mass. For example, U.S. Pat. Nos. 5,015,906 and 5,187,399 employ high frequency sinusoidal excitation circuitry for levitation and control. U.S. Pat. No. 4,521,854 is an example of electrostatic levitation requiring a complex sensing and feedback system to maintain the proof mass in its floating position.

In view of the foregoing, a need exists in the art for a floating MEMS device that includes self-stabilizing levitation without requiring sensing and/or feedback systems for controlling the levitation of the proof mass.

SUMMARY OF THE INVENTION

Accordingly and advantageously the present invention includes MEMS devices and applications thereof in which a proof mass is caused to levitate by electrostatic repulsion.

The present invention relates to a floating MEMS device (FLEMS) in which a proof mass is levitated electrostatically without the need for feedback control means and, once levitated, without mechanical contact between the proof mass and any other portion of the device. This is in contrast with other MEMS devices, including accelerometers and inertial sensors, in which deflection of a mechanically-coupled proof mass, cantilevered beam or other structure is the basis for measuring acceleration. In various embodiments of the present non-contact floating MEMS device, mechanical wear is substantially eliminated and mechanical parasitic effects are sharply reduced or eliminated. Thus, an important objective of the present invention is to produce a floating MEMS device in which the proof mass has no mechanical contact with other portions of the device.

Configurations of electrodes for a FLEMS device are described that, when charged with like charges as the proof mass, result in self-stabilized floating of the proof mass based upon electrostatic repulsion. Self-stabilization results from a FLEMS structure such that, when the proof mass is displaced from its equilibrium position, electrostatic forces arise tending to restore the proof to its equilibrium position. The magnitude of the restoring electrostatic forces tend to increase in magnitude as the proof mass undergoes a larger displacement from its equilibrium position. Thus, another objective of the present invention is to produce a self-stabilizing FLEMS device that does not require feedback control systems. In addition, since only like electrical charges are in close proximity, the dangers of short circuits are markedly reduced.

Perturbations causing displacement of the proof mass can conveniently be measured by measuring the changes in electrical properties of the stabilization electrodes or electrical properties of the electrodes causing floating, and/or the electrical properties of additional sensing electrodes that can be included to further enhance sensing capabilities. Drive electrodes can also be included that allow forces to be applied to the charged proof mass resulting in a floating, electrically controllable MEMS device. Numerous applications are possible including: 1) Charge storage device. 2) GHz resonator. 3) Accelerometer. 4) Wide-angle scanner. 5) Magnetometer. 6) Nanogravity sensor. 7) Inertial navigation. 8) Magnetic confinement. 9) Quantum gyros. 10) Harsh-environment applications. 11) Thermal isolation applications. 12) Micro transport.

FLEMS devices can conveniently be fabricated by lithographic technologies developed, in part, for the fabrication of integrated circuits. In addition, FLEMS devices can be fabricated by means of various three-dimensional microfabrication technologies that have been developed by several research groups and publicly available including EFAB™, PolyMUMPs, among others.

Other embodiments of FLEMS devices include a proof mass attached to a plurality of side electrodes that carry a substantial portion of the electrostatic charge of the proof mass. The side electrodes can be terminated by one or more termination blocks or other structures that lead to stable levitation of the proof mass and attached side electrodes when this combined structure is embedded in a suitable configuration of stabilizing electrodes.

The proof mass and the stabilizing electrodes can be charged by a variety of techniques including contact with an external voltage source, charging by means of electrification by induction and/or conduction, capacitance, tribocharging, electric discharge, among other methods.

Once charged FLEMS, devices typically require almost no additional electric power, depending on the magnitude of leakage currents for the structures and materials used in the FLEMS device and for the environmental conditions in which it is operated. That is, it is not required to maintain continuous contact between the charging source and the stabilizing electrodes. The charging source can be disconnected and re-engaged only when necessary to replenish the charge that is lost over time due to leakage.

Further, the operating range of FLEMS devices is, or can be made, very large. The response of a FLEMS device to various external perturbations can be changed by changing the amount of electric charge residing on various portions of the FLEMS device, including dynamic changes in real-time or near real-time during operation of the device. In addition, FLEMS devices are typically largely insensitive to operating temperatures.

These and other advantages are achieved in accordance with the present invention as described in detail below.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not to scale.

The techniques of the present invention can readily be understood by considering the following detailed description in conjunction with the accompanying drawings, in which:

FIG. 1. FIGS. 1a and 1b depict in schematic cross-sectional view structures arising in one approach to FLEMS fabrication. FIGS. 1c, 1d, 1e depict in schematic cross-sectional view other structures arising in FLEMS fabrication. All numerical values are approximate.

FIGS. 6a–6c are schematic perspective views (6a, 6b) and a cut-away view (6c) of a typical FLEMS two-axis mirror/scanner.

FIGS. 8a and 8b depict in top view (8a) and side view (8b) typical magnetic fields generated by a FLEMS flux capacitor.

DETAILED DESCRIPTION OF THE INVENTION

Figure 1B:
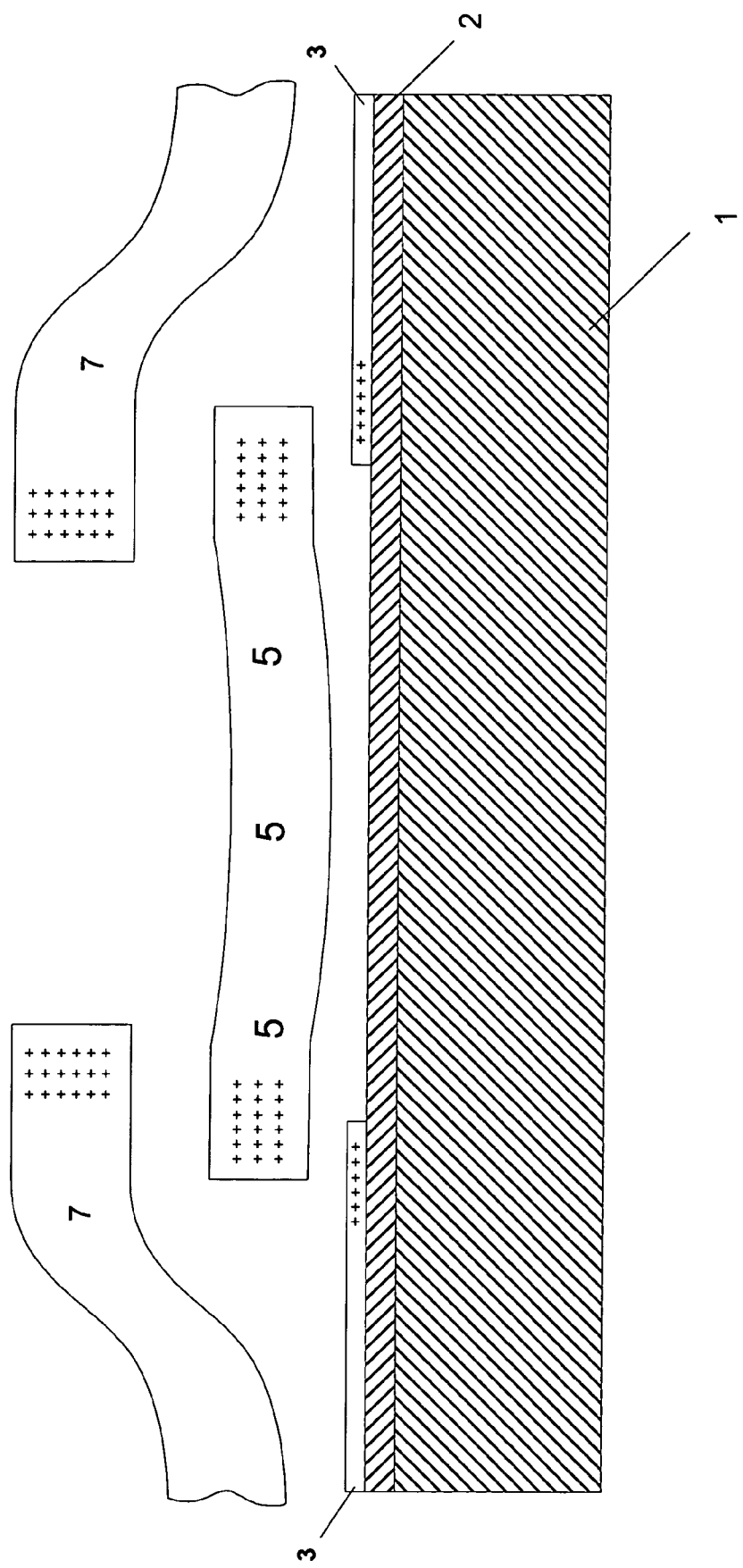

After considering the following description, those skilled in the art will clearly realize that the teachings of the invention can be readily utilized as Floating MicroElectro-Mechanical Systems and devices (FLEMS) as well as for the fabrication of FLEMS devices and the use thereof in various applications.

FIG. 1 depicts in schematic cross-sectional view structures arising in one approach to the fabrication of FLEMS devices pursuant to some embodiments of the present invention. The FLEMS fabrication procedures described herein are exemplary and not intended to be limiting as variations apparent to those with ordinary skills in the art can also be employed within the intent and scope of the present invention.

On a semiconducting substrate 1, typically silicon, a layer of dielectric 2 is deposited. Dielectric 2 is typically silicon nitride on a silicon substrate 1 although other combinations of materials are not excluded. Typically, dielectric layer 2 is about 0.5 μm in thickness (μm=micron=$10^{-6}$ meter).

A layer of conductive material, typically polysilicon ("poly"), is deposited on the dielectric layer 2. The poly layer is typically about 0.5 μm in thickness. A continuous poly layer is deposited and then patterned by known conventional lithographic means to produce an opening in poly layer 3 as depicted in FIG. 1a.

Another dielectric layer, 4, is then deposited on patterned layer 3. Dielectric layer 4 is typically silicon dioxide ("oxide") and has a typical thickness of approximately 2 μm. In practice, it is expected that the various layers will deposit substantially conformally in the fabrication of the device depicted in FIG. 1. However, conformal layering is not depicted in FIG. 1 for simplicity.

A second conductive layer 5 is deposited on dielectric layer 4 and patterned so as to have a shape substantially as depicted in FIG. 1. Typically, dielectric layer 5 is also poly and about 2 μm in thickness. Conductive layer 5 becomes the floating element or "proof mass."

A second layer of dielectric 6, typically another layer of oxide, is deposited on the patterned conductor 4 and comes into contact with dielectric layer 4 around the periphery of conductor 5 as depicted in FIG. 1. Typically, oxide layer 6 is approximately 0.75 μm thick.

A third conductive layer 7 is deposited on dielectric layer 6 and patterned so as to have a shape substantially as depicted in FIG. 1. Conductive layer 7 is typically another layer of poly having a thickness of approximately 1.5 μm.

The structure depicted in FIG. 1 is shown in cross-section. It is convenient for the structure to be fabricated so as to have approximate rotational symmetry about a central vertical axis 8. Thus, FIG. 1 depicts a radial cross-sectional view of a substantially circular structure. However, approximate rotational symmetry is not required of structures fabricated as depicted in FIG. 1 and square, rectangular, polygonal, elliptical or any other shape can be used as convenient for the particular application under consideration and/or for particular fabrication procedures and/or materials. Indeed, a linear structure can be fabricated by means of the procedures described herein with a long z dimension perpendicular to the plane of FIG. 1 and a substantially constant cross-section as depicted in FIG. 1 perpendicular to the z axis. Such a device, when coupled with suitable drive electrodes as described elsewhere herein, is capable of transporting the proof mass 5 linearly along the z axis. When coupled with appropriate driving voltages, the proof mass can be caused to accelerate to high velocity along the z direction.

The lateral extent of the structure, for example the length of conductor 5, is not critical in the fabrication or operation of the device and can be chosen for ease of fabrication and/or for a particular field of application. Typical FLEMS applications will employ structures with conductors 5 having typical lengths around a hundred to a few hundred microns, although larger or smaller structures are not excluded.

Following the fabrication of a structure as depicted schematically in FIG. 1, insulating layers 4 and 6 are removed. Hydrofluoric acid, HF, is a commonly-used etchant for silicon dioxide insulating layers. Thus, conductor 5 becomes detached from other structures of the device but, due to the overhanging geometry of conductor 7, remains substantially entrapped in the space between conductors 7 and 3 as depicted in FIG. 1a.

The removal of insulating layers 4 and 6 causes conductor 5 to come to rest under the force of its own weight in contact with conductors 3 for the orientation depicted in FIG. 1a, or conductors 7 for an inverted configuration. To be concrete in our description, we presume the force of gravity acts downward in FIG. 1a, understanding thereby that no essential differences occur if the configuration were inverted.

Figure 1D:
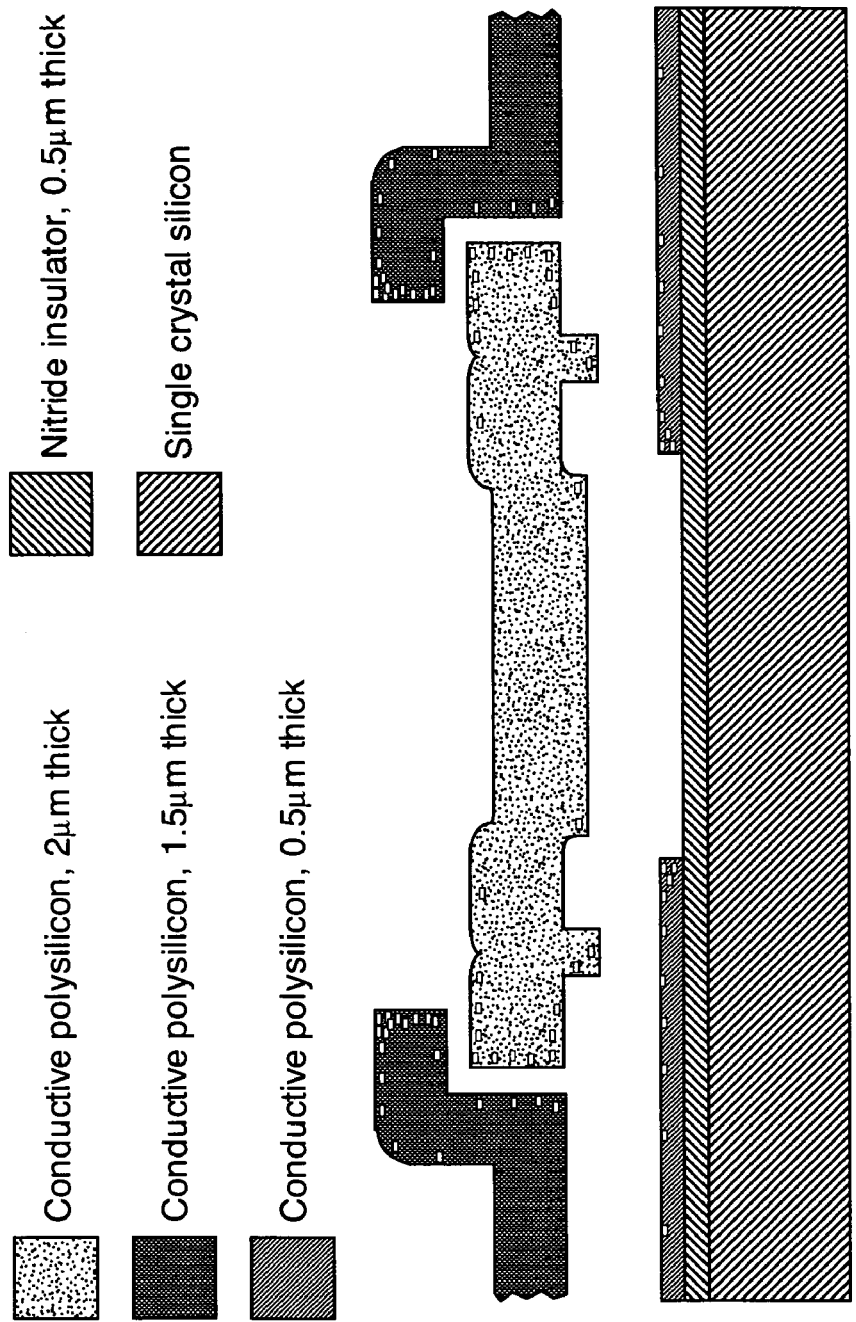

FIGS. 1c, 1d and 1e depict alternative structures for the FLEMS device of FIG. 1a and 1b. Although the dimensions and structures depicted in FIGS. 1c, 1d and 1e are expected to be not too far from realistic for functioning FLEMS devices, the depiction is schematic and the dimensions are approximate. However, FIG. 1d depicts negative charges in contrast to the positive charges depicted in FIG. 1b. This illustrates that the like-charge repulsion leading to levitation in a FLEMS device can result from either (+, +) or (−, −) repulsion. Furthermore, it is quite feasible that (+, +) repulsion occurs in one portion of a FLEMS device while (−, −) repulsion occurs in another portion of the device One convenient method for charging the conductors involves the application of a voltage to conductors 3 and 7, thereby delivering charge to conductor 5 in contact therewith. However, when charged, conductor 5 will repel from both 3 and 7 to float as depicted in FIG. 1b. Thus, conductor 3 remains in electrical contact with conductor 3 for so long as is necessary for conductor 5 to accumulate sufficient charge to repel or "float" and break electrical contact with conductors 3. In some circumstances it is advantageous for the floating conductor 5 to receive substantially more charge than the minimum necessary to cause floating and severance of electrical contact. Thus, some embodiments of the present invention include electrical contact(s) for delivering charge directly to conductor 5. Other embodiments include mechanical and/or chemical means for maintaining conductor 5 in electrical contact with conductor 3 despite the generation of electrical repulsion greatly exceeding the weight of conductor 5. Such embodiments typically allow for the mechanical, chemical and/or thermal release (for example, a meltable solder), when the desired charge has been delivered to floating conductor 5. It is advantageous that the charging mechanism be such that it can be conveniently employed numerous times as the device typically requires numerous re-chargings over its service lifetime.

FIG. 1b depicts floating conductor 5 suspended by electrical repulsion between conductors 3 and 7. Positive charges are depicted in FIG. 1b for convenience but negative charges can also be employed to provide the mutual repulsions. The charges are depicted in FIG. 1b schematically to depict mutual repulsion, not to indicate a realistic charge distribution on conductors 3, 5 or 7. Charges will distribute themselves over the conductors in response so the mutual repulsions between like charges within a conductor and between conductors lead to a distribution having no net forces on the charges. A somewhat more realistic (but still approximate) charge distribution is depicted in FIG. 1d.

It is clear from FIG. 1b that the configuration of the floating conductor 5 possesses an inherent stability without the necessity for position detectors, feedback means, or the like. A displacement of floating conductor 5 in any direction brings like charges closer together hereby increasing the restoring electrical repulsive force tending to return the floating conductor to the position from which it came. Thus, once charged, floating conductor 5 is captured between stabilizing conductors 3 and 7 in FIG. 1b and can remain so captured indefinitely, so long as the electrical charges leading to restoring forces remain sufficiently large to overcome perturbations or disturbances to which the device is subjected.

In addition, it is clear from FIG. 1b that the position and/or motion of conductor 5 can be simply controlled by time-varying application of different charges to conductors 3 and/or 7. Complex control of motion and/or position may call for more involved configurations of stabilizing conductors, several examples of which are described herein while additional examples would be apparent to those with ordinary skills in the art.

Conductors 3 and 7 can be in electrical contact with each other by means of one or more contacts not depicted in FIG. 1b, or electrically isolated from each other. It is advantageous in some embodiments of the present invention to provide electrical isolation for conductors 3 and 7 such that a displacement of floating conductor 5 towards one stabilizing conductor (say conductor 3) does not permit charge to flow from conductor 3 to conductor 7, thereby reducing the stabilization forces on the floating conductor. Some embodiments of the present invention involve voltage and/or current sensing devices connected between stabilizing electrodes in order to detect and perhaps measure disturbances or perturbations to which floating conductor 5 may be subject as, for example, in the construction of an accelerometer. However, in some embodiments, it is advantageous to utilize additional electrodes in place of, or in addition to, the stabilizing electrodes for purposes of sensing. Optical sensing means can also be employed within the scope of the present invention.

The devices depicted and described in connection with FIGS. 1a and 1b are conveniently fabricated with conductive components 3, 5 and 7. However, the devices are not inherently limited to conductive components and can employ semiconductive and/or dielectric components as 3, 5, and 7 so long as sufficient etching selectivity is present to permit removal of sacrificial layers 4 and 6. However, in such cases charging of floating component 5 by gravity-induced contact and electrical conduction with another element is typically not feasible. However, other charging mechanisms as described elsewhere herein can be employed.

The devices depicted and described in connection with FIGS. 1a and 1b use the same materials for layers 3, 5 and 7 (for example, conductive polysilicon) and for sacrificial layers 2 and 4 (for example, silicon dioxide) as a matter of convenience and not as an inherent limitation in the devices or fabrication processes. Different conductive layers 3, 5, and 7 can be employed and 3, 5, 7 need not be wholly made from the same material so long as these layers have adequate charge-retaining electrical properties and adequate etching selectivity with respect to the sacrificial layers 2 and 4. Likewise, different sacrificial layers may be employed in layers 2 and 4 so long as adequate etching selectivity is retained.

In addition to fabrication procedures described herein, FLEMS devices pursuant to some embodiments of the present invention can also be fabricated by means of the EFAB™ fabrication techniques of Microfabrica, Inc. of Burbank, Calif. (formerly the MEMGen Corporation). EFAB™ technology is essentially an additive microfabrication process based on electrodeposition of multiple layers of metals and capable of producing three dimensional devices. Further information concerning EFAB™ is described in materials printed from the website having URL www.microfabrica.com. Hard copies have been provided pursuant to an Information Disclosure Statement filed herewith and are incorporated herein by reference.

Other techniques for fabrication of three dimensional microscale structures include fabrication techniques developed by the MCNC Research and Development Institute of Research Triangle Park, N.C. (founded as the Microelectronics Center of North Carolina) and applied to the fabrication of vertical interconnects for integrated circuits. Further description of the MCNC fabrication techniques is described in materials printed from the website having the following URL: www.mcnc.org. Hard copies have been provided pursuant to an Information Disclosure Statement filed herewith and incorporated herein by reference. A related fabrication technique "PolyMUMPs" by MEMSCAP, Inc. is described in materials printed from the website having the following URL: www.memscao.com/memrus/docs/polymumps.dr.v10.pdf>. Hard copies have been provided pursuant to an Information Disclosure Statement filed herewith and incorporated herein by reference.

Figure 2A:
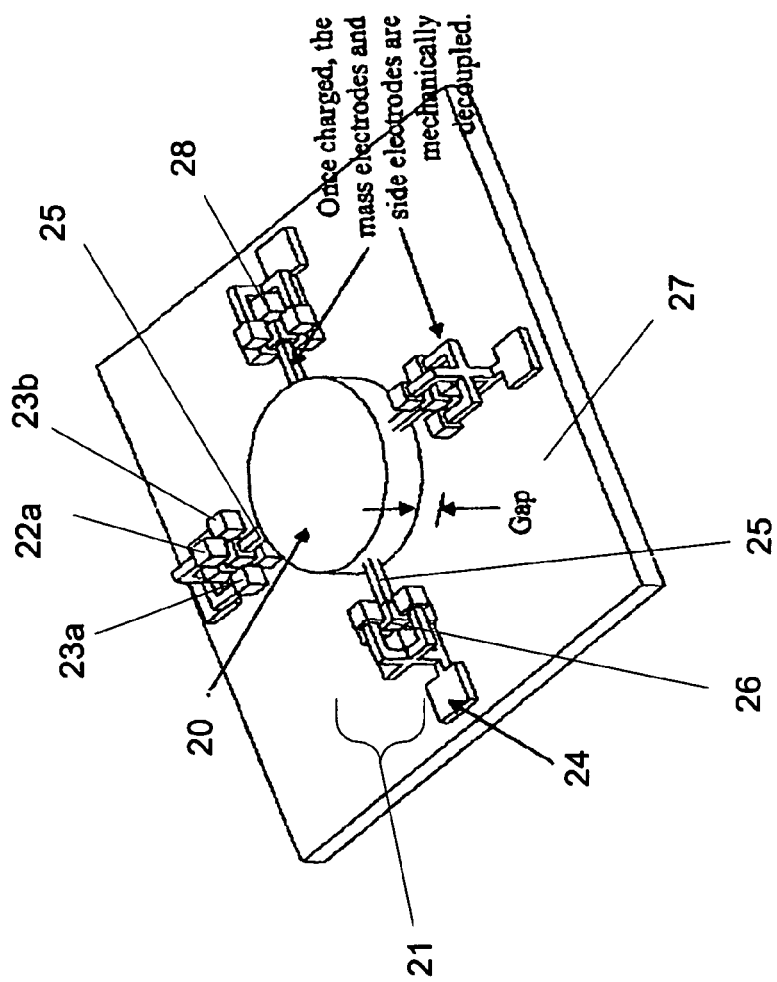
FIGS. 2a and 2b depict in perspective view (2a) and side view (2b) a FLEMS device. All numerical values are approximate.
Figure 2B:
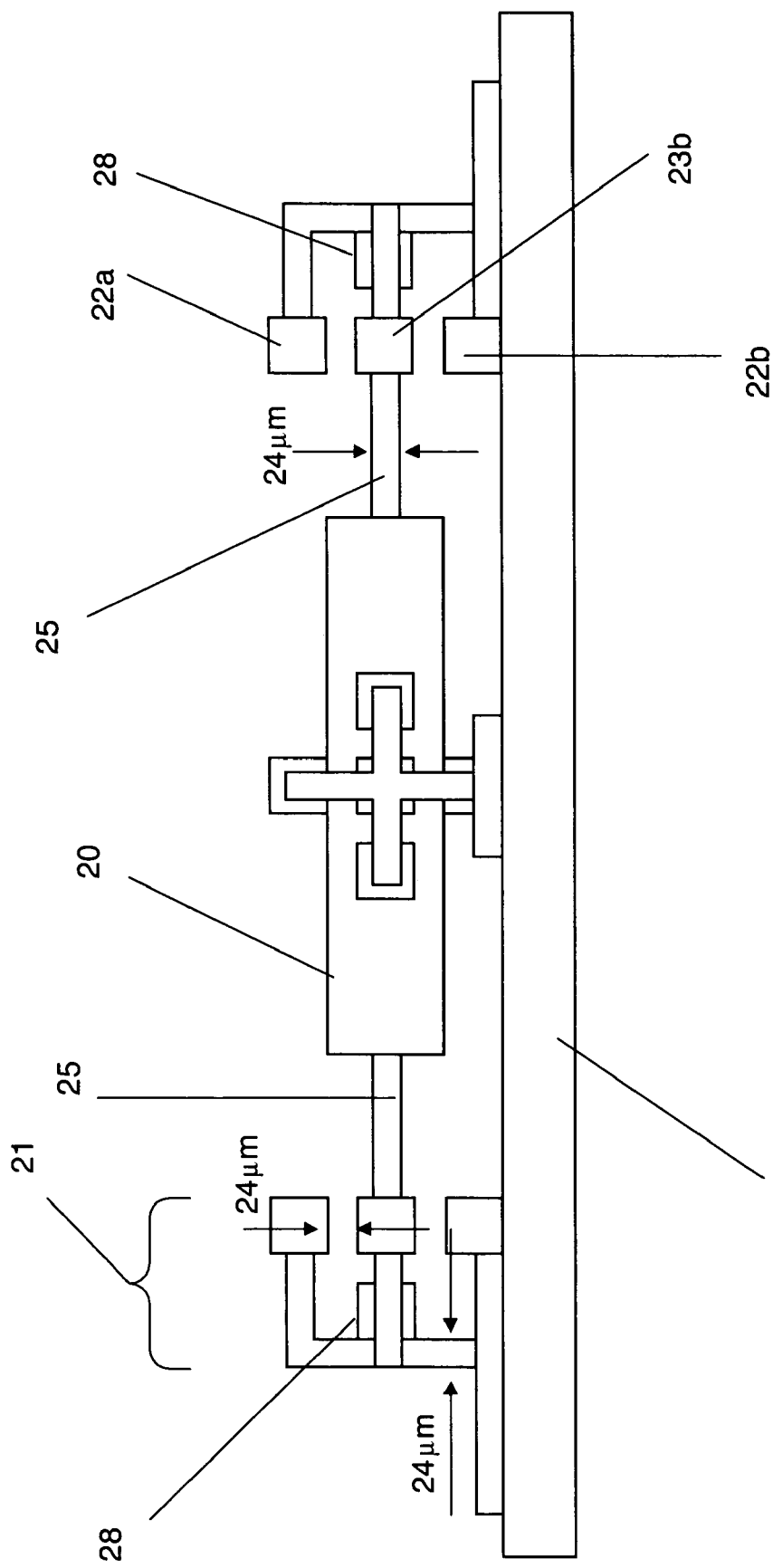
Figure 3A:
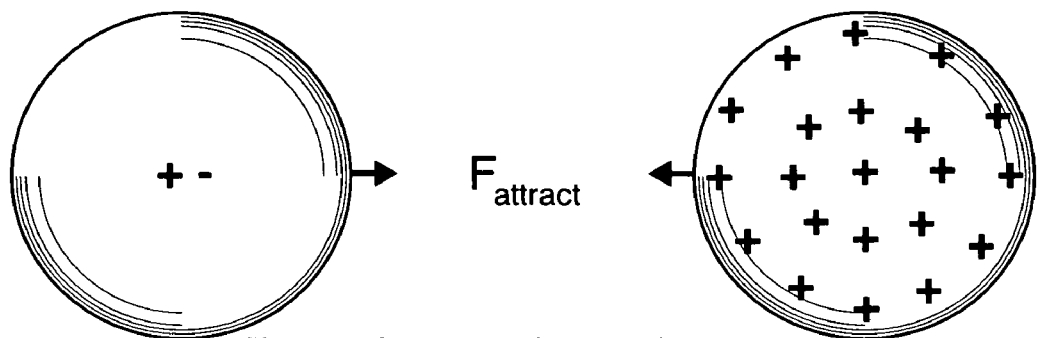
FIGS. 3a–3f are schematic depictions of various charging mechanisms.
Figure 3B:
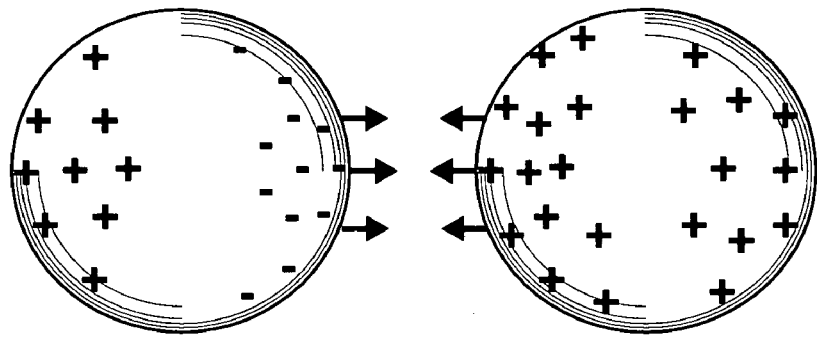
Figure 3C:
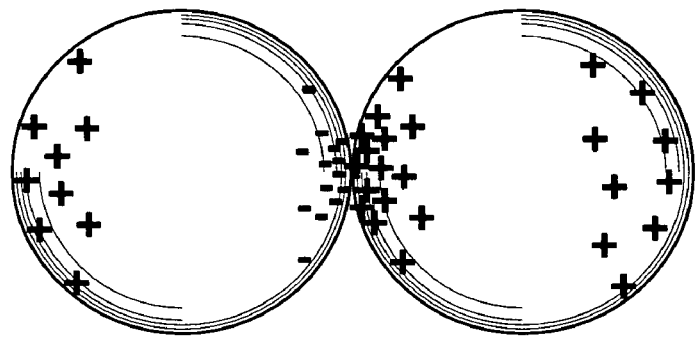
Figure 3D:
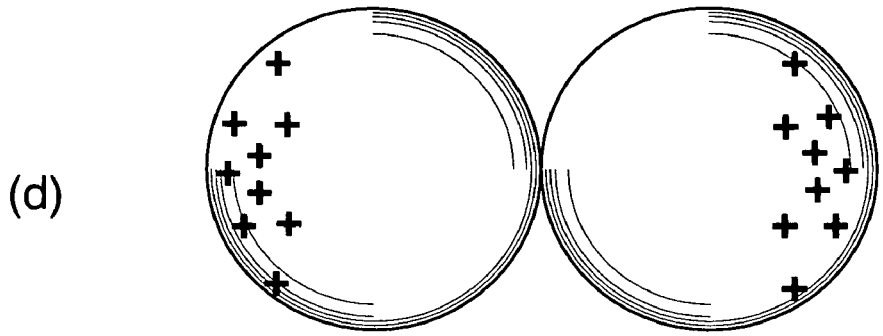
Figure 3E:
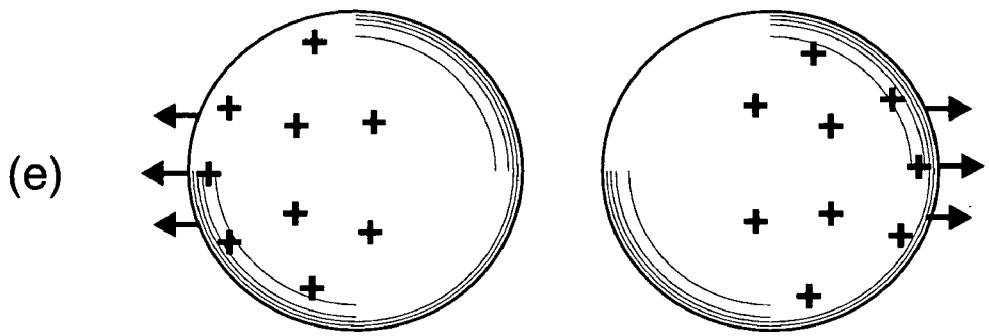
Figure 3F:
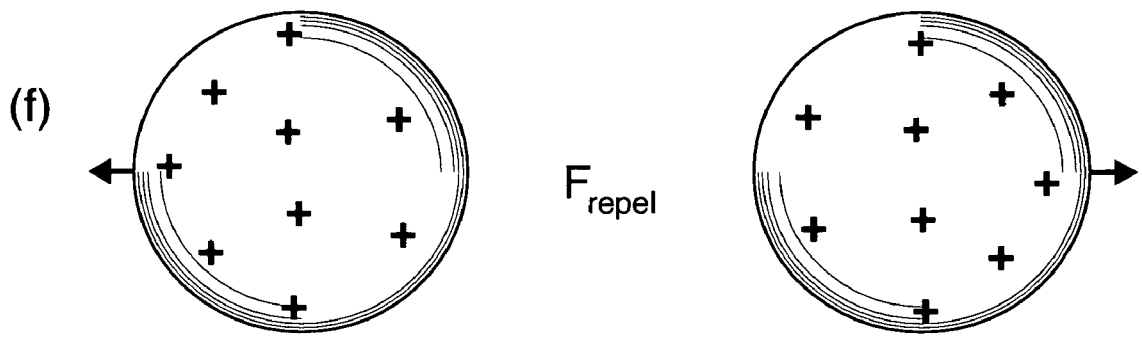

Another embodiment of a FLEMS device pursuant to some embodiments of the present invention is depicted in perspective view in FIG. 2a and in cross-sectional view in FIG. 2b. A proof mass 20 is attached to a plurality of side electrodes 25. The side electrodes can be terminated by a termination block 26 or other structure such that, when imbedded in levitating and stabilizing electrodes 21, an advantageous configuration for floating and stabilizing the proof mass results.

As described in detail elsewhere, the forces causing the proof mass to float and the stabilization forces for the floating proof mass result chiefly from electrostatic repulsion between the components of the stabilizing electrodes 21 and the side electrodes (and termination blocks, if any). In some applications, it is advantageous for charges to be isolated on the side electrodes and/or termination blocks and be hindered from flowing away from the stabilizing electrodes, 21. Thus, it is advantageous in such cases for the proof mass to be insulating preventing charge from leaving the side electrodes. It is also advantageous in some embodiments for all or part of the side electrodes to be insulating, retaining charge on the termination blocks, 26, and/or on the portion of side electrodes 25 in proximity to the stabilizing electrode structure 21. However, aside from these guidelines, the choice of materials for the FLEMS device depicted in FIGS. 2a and 2b is largely within the design discretion of the FLEMS designers.

However, in other instances, the repulsion of like charges inherently causes like charges deposited on the proof mass to separate and to congregate chiefly in the side electrodes when both proof mass and side electrodes (and termination blocks, if any) are conductive. In typical instances, this internal repulsion keeps sufficient charge on or near the stabilizing electrodes to provide for levitation in spite of repulsion of like charges in the stabilizing electrodes and the side electrodes tending to drive charges out of the side electrodes. Thus, both conductive and partially conductive structures can be employed for all or part of the assembly consisting of the proof mass and the side electrodes.

The side view of the FLEMS device of FIG. 2a is depicted in FIG. 2b, including exemplary dimensions for various structures and gaps. These dimensions are both approximate and illustrative as different dimensions, or different combinations of dimensions, can be employed within the design discretion of the FLEMS designers and within the scope of the present invention.

With both stabilizing electrodes and side electrodes uncharged, the proof mass typically lies on or near the substrate 27 with the side electrodes or the termination blocks resting on the lower electrodes 22b of the stabilizing electrodes. Numerous charging methods can be employed including bringing the side electrodes and stabilizing electrodes into contact with an external voltage, or charging by means of electrification by induction and/or conduction by contact with a charged body as depicted schematically in FIGS. 3a–3f. Charging can be accomplished by several methods including, but not limited to, capacitance, tribocharging, electric discharge, contact with a battery or other voltage source, among other methods. Upon charging the stabilizing electrodes and the side electrodes (and possibly the proof mass), the resulting like-charge repulsion causes the proof mass to repel from the stabilizing electrodes.

Once charged, it is advantageous in many applications for the proof mass to avoid or reduce charge leakage, thereby increasing the time between re-charging. Thus, it is advantageous in such instances for the proof mass to be electrically isolated from various means of charge leakage including sources of ionization of the ambient gas and the like, for example, by immersion in a vacuum, reduction of sharp points or edges in charge-containing regions, among other techniques. Applications such as accelerometers in space are particularly in need of long times between charging, and possibly subject to harsh conditions of ambient ionizing radiation.

Several advantages derive from the FLEMS structure depicted in FIGS. 2a and 2b and variations thereof. For example, as a noncontact floating device, mechanical wear is substantially eliminated. In addition, if both the side electrodes/proof mass and the stabilizing electrodes are charged to the same potential, there is no danger of short-circuiting, in contrast to floating devices based upon the attraction of opposite charges. Also, since the proof mass is mechanically decoupled from its surroundings, mechanical parasitic effects are sharply reduced or eliminated including, for example, thermal isolation, isolation from electrical noise and independence from process variations such as Young's modulus, Poisson's ratio, among others. Additionally, as noted elsewhere, once charged the FLEMS devices typically require almost no additional electric power, depending on the magnitude of leakage currents for the structures and materials used in the FLEMS device and for the environmental conditions in which it is operated. To be clear, it is not required to maintain the contact between the charging source and the stabilizing electrodes. The charging source may be re-engaged periodically to replenish the charge that is lost over time due to leakage.

Further, the operating range of the FLEMS devices pursuant to some embodiments of the present invention is, or can be made, very large. Adjustment of the charge carried by the stabilizing electrodes and/or the side electrodes and proof mass typically changes the mechanical characteristics of levitation, including changing the restoring forces experienced in response to displacements, changing induced voltages and/or currents, among other effects. Thus, device response to various external perturbations can be changed merely by changing the charges on various portions of the FLEMS device, including dynamic changes in real-time or near real-time during operation of the device.

In addition, FLEMS devices are typically largely insensitive to operating temperatures, performing throughout substantially any temperature range at which the mechanical and/or electrical properties of the materials are sufficient for stable levitation. Some applications of FLEMS devices make use of optical, magnetic and/or other material properties which also should not substantially degrade over the desired operating range.

The devices depicted schematically in FIGS. 2a and 2b are illustrative of typical FLEMS devices and do not encompass the full range of embodiments within the scope of the present invention. For example, the number of stabilizing electrodes and side electrodes need not be four as depicted, but can be either fewer or greater. Examples of devices having two electrodes are given elsewhere herein. FIGS. 1a and 1b depict what is essentially a continuum of side and stabilizing electrodes. Various numbers between these limits are also possible and included within the scope of the present invention.

The present invention is not limited to two-dimensional embodiments as depicted in FIGS. 1 and 2. Examples follow of embodiments of FLEMS devices having substantially linear structures with two stabilizing and side electrodes. Additional stabilizing and side electrodes can be added analogous to those depicted in FIG. 2 but in directions perpendicular (above and below) the proof mass, leading to a family of FLEMS devices in three-dimensions.

EXAMPLES

1. Accelerometer—Inertial Sensor

Accelerometers and inertial sensors have numerous uses including guidance and navigation, gravitational field detection, collision sensors (as for vehicle air bag deployment), among other applications. The FLEMS embodiments depicted in FIGS. 2a and 2b are useful for this application. As proof mass 20 experiences a force such as that caused by an acceleration, impact, gravitational field, among others, the charges residing on or near termination blocks 26 and side conductors 25 will undergo a displacement with respect to charges residing on the stabilizing structures 21. This charge displacement will induce voltages and/or currents that can be measured and thereby determine the displacement of proof mass 20. The displacement of proof mass 20 provides information concerning the acceleration or other environmental perturbation causing the displacement.

As depicted in FIGS. 2a and 2b, there are four termination blocks 26, each of which is in proximity to five charged regions of a stabilizing structure depicted as blocks in FIGS. 2; two left-right horizontal blocks, 23a and 23b; two up-down vertical blocks 22a and 22b, and one in-out block, 28 for each stabilizing structure, or twenty (20) in all. Recognizing that the proof mass need not displace in a horizontal plane only but may elevate, twist, tilt and/or rotate, sensing displacements with respect to all 20 blocks of the stabilizing structures can provide useful information and redundant checks on the motion of proof mass 20. In some applications, it may be economical to sense fewer than all 20 possible displacements or to combine some sensing measurements into unitary groups, all of which are envisioned within the scope of the present invention. In addition, displacements can be determined electronically as a function of time, permitting the determination of more detailed components and higher derivatives of velocity vs time behavior than acceleration.

2. RF communications—GHz Filter

MicroelectroElectroMechanical ("MEMS") resonators and filters are common devices finding use in many types of cell phone and other forms of wireless communication. However, conventional devices are typically mechanically mounted to a substrate and, consequently, suffer significant energy losses through the mountings. This is an important problem in low energy wireless communication in which such MEMS devices are frequently employed. In addition, such traditional MEMS devices are hindered in achieving higher quality factor, "higher-Q" components.

Figure 4:
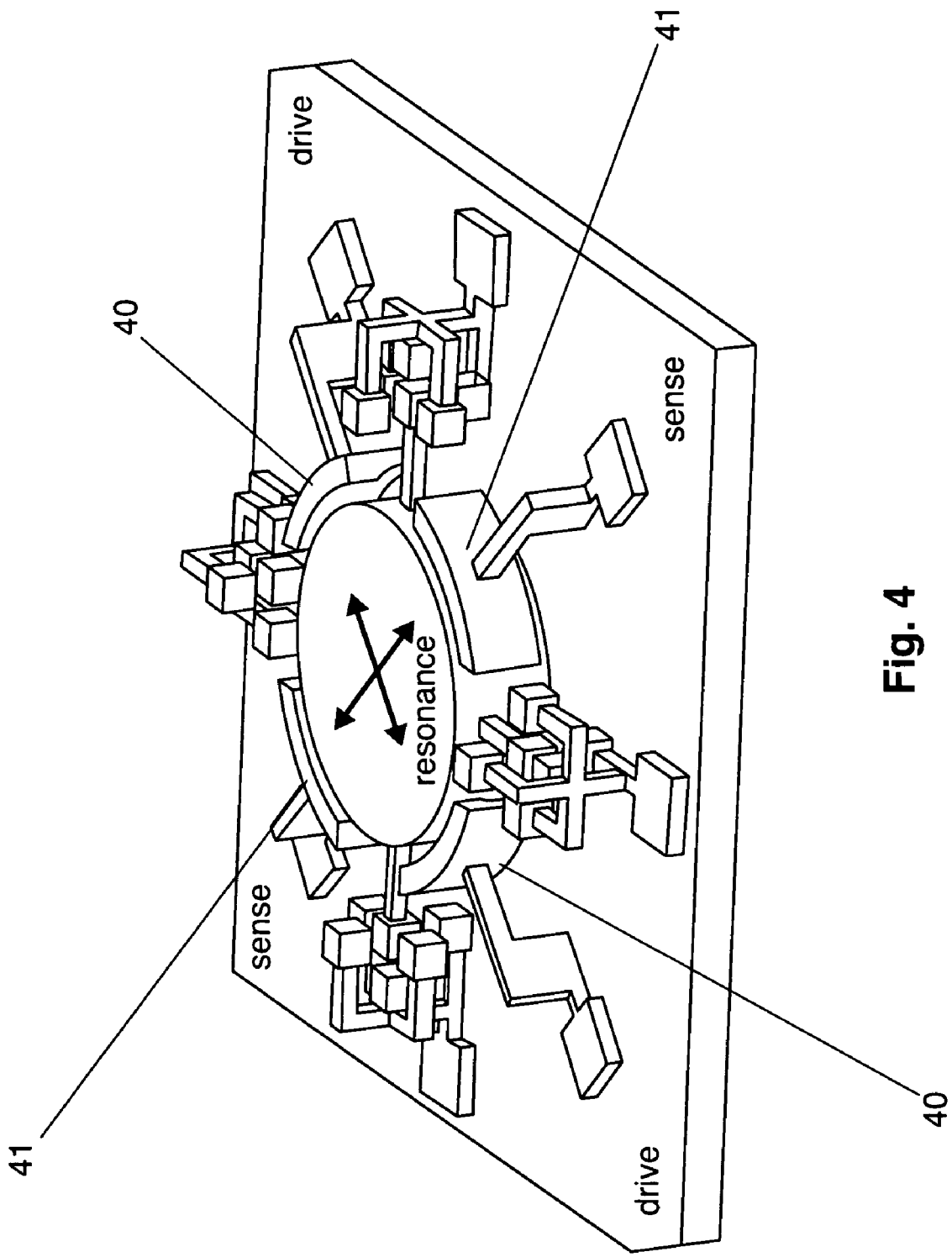
FIG. 4 is a schematic perspective view of a typical FLEMS device including sensing and drive electrodes.

The present FLEMS devices float without mechanical supports and thus cannot lose energy through mechanical contact. A typical family of FLEMS devices configured for use as resonators or filters is depicted in perspective view in FIG. 4. Building on the basic FLEMS configurations of FIGS. 2a and 2b, a pair of additional side electrodes 40 are included to drive the bulk material of the proof mass (having a substantially cylindrical shape in some embodiments) into a resonance mode. Another pair of electrodes 41 may be added in these embodiments to act as sensors and to measure the deforming cylindrical modes.

3. Mirror—Scanner

Figure 5A:
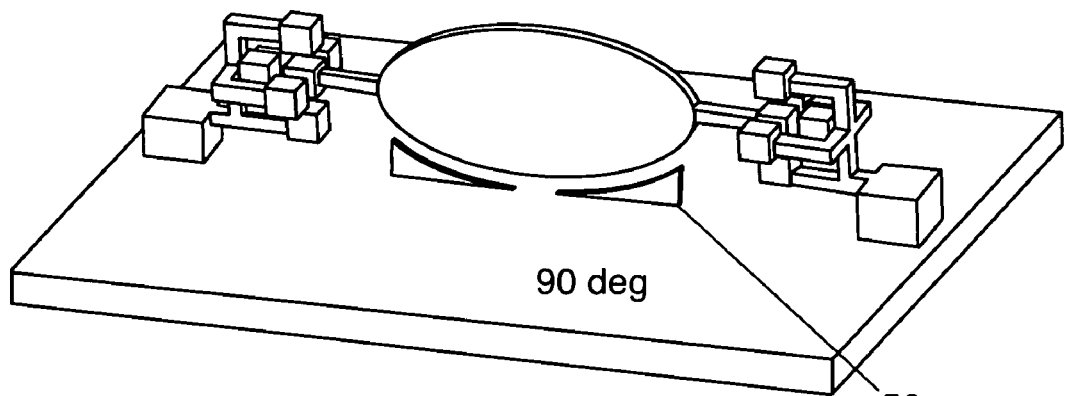
FIGS. 5a–5c are schematic perspective views of a typical FLEMS mirror/scanner in various angular positions.
Figure 5B:
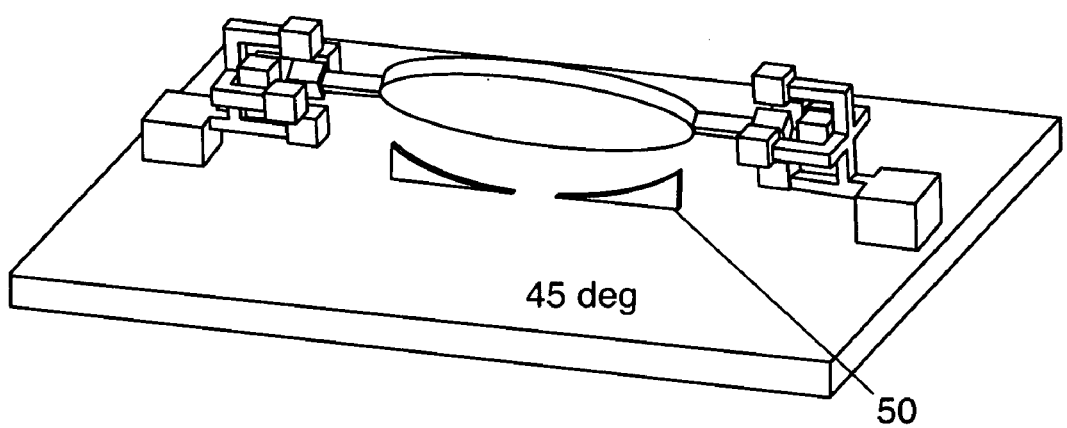
Figure 5C:
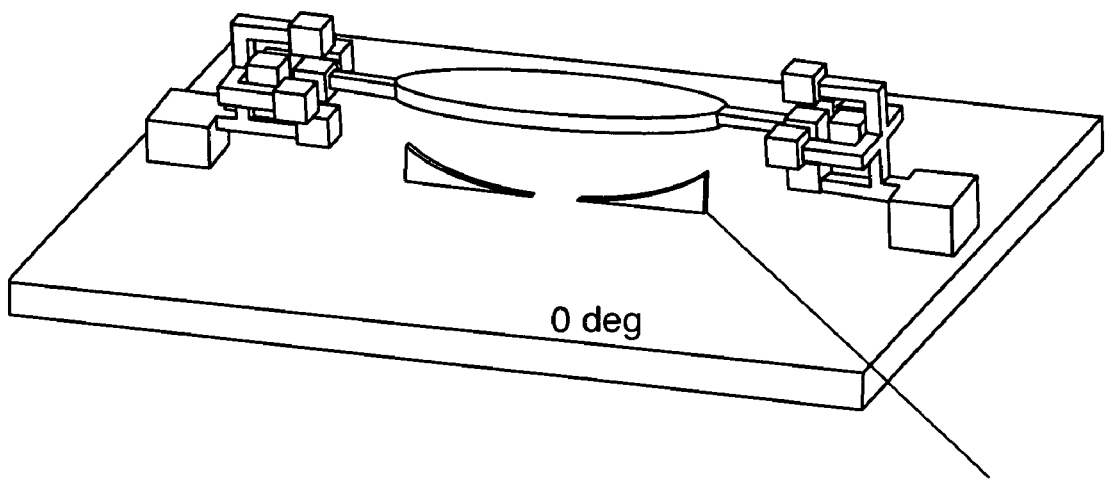

Mounting a FLEMS device by means of two stabilizing structures leads to a device of the type depicted in FIG. 5. In this embodiment, the stabilizing structures function as virtually frictionless pin joints or pivots allowing the proof mass free rotation. Applying a time-varying charge to the electrode beneath the mirror allows the position of the mirror to be adjusted to a desired angle. Three typical angular positions are depicted in FIG. 5. Thus, a reflective proof mass functions as a mirror/scanner under control of the charge delivered to electrode 50. For rapid positioning of the mirror, it may be advantageous to include a damping mechanism, typically an electromagnetic and/or electromechanical damper, not pictured in FIG. 5.

It is advantageous in many applications for the proof mass (mirror) in FIG. 5 to have a size and/or shape that permits full 360 deg. rotation without contacting the substrate supporting the FLEMS device. However, this is not an inherent limitation of the structure as mirrors having other shapes can be employed along with software and/or hardware safeguards insuring against damaging contact between mirror and substrate.

4. Gyro—Two-Axis Mirror-Scanner

Figure 6A:
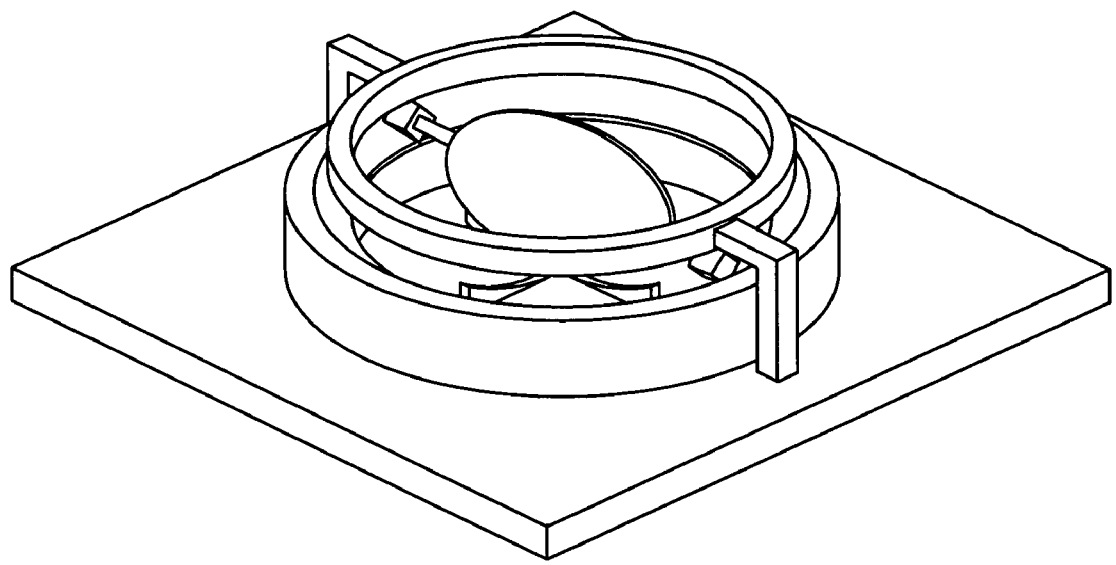
Figure 6B:
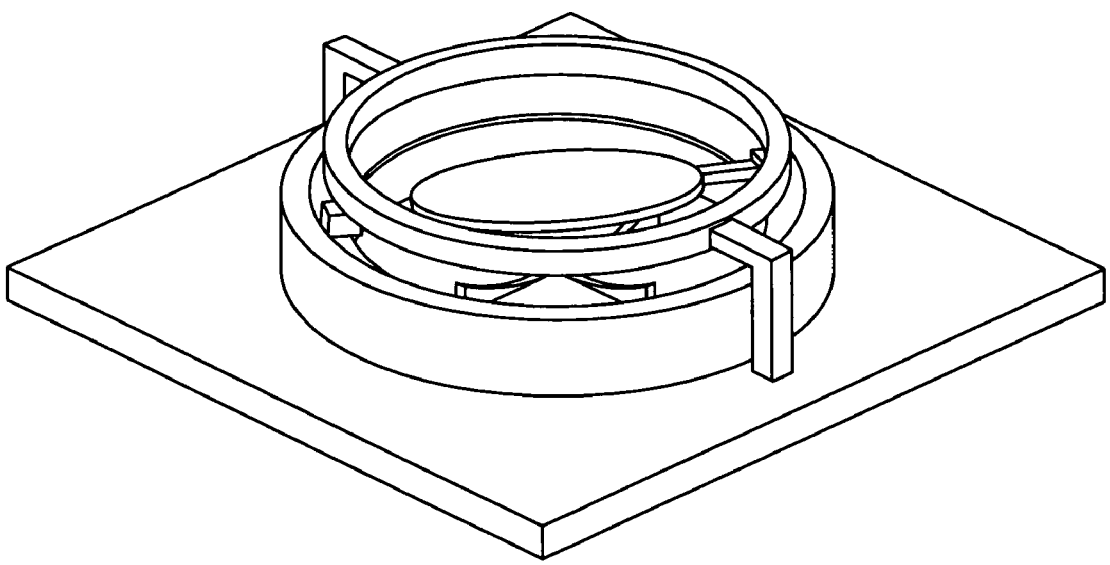

By physically permitting one pair of stabilizing electrodes to undergo free rotation in a guide track as depicted in FIG. 6, the proof mass can rotate independently about two perpendicular axes. FIG. 6a depicts rotation about the local major axis, radially through the proof mass and substantially parallel to the plane of the substrate. FIG. 6b depicts rotation about the global z axis perpendicular to the substrate. The cut-away view in FIG. 6c depicts the control electrodes 61 to which a sinusoid or other time-varying charge is applied to control the motion of the proof mass. Electrodes 60 in FIG. 6c typically remain constantly charged during the operation of the device. A reflective proof mass results in a mirror-scanner capable of independent control about two perpendicular axes. A gyro results from the use of a proof mass having suitable mass and shape such that, once rotating, the proof tends to retain its orientation in space regardless of the rotational motion of the FLEMS device itself.

5. FLEMS Flux Capacitor

Neither the structure nor the mode of operation are clear for Dr. Emmett Brown's flux capacitor in the Back to the Future movie trilogy. However, by "flux capacitor" herein we intend a capacitive device capable of accepting and retaining a substantial amount of charge relative to its size and mass; that is, a substantial charge density. Furthermore, by rotating that stored charge at a high rate of speed by means of the non-contact FLEMS technology described herein, a significant amount of magnetic flux can be generated.

Figure 7:
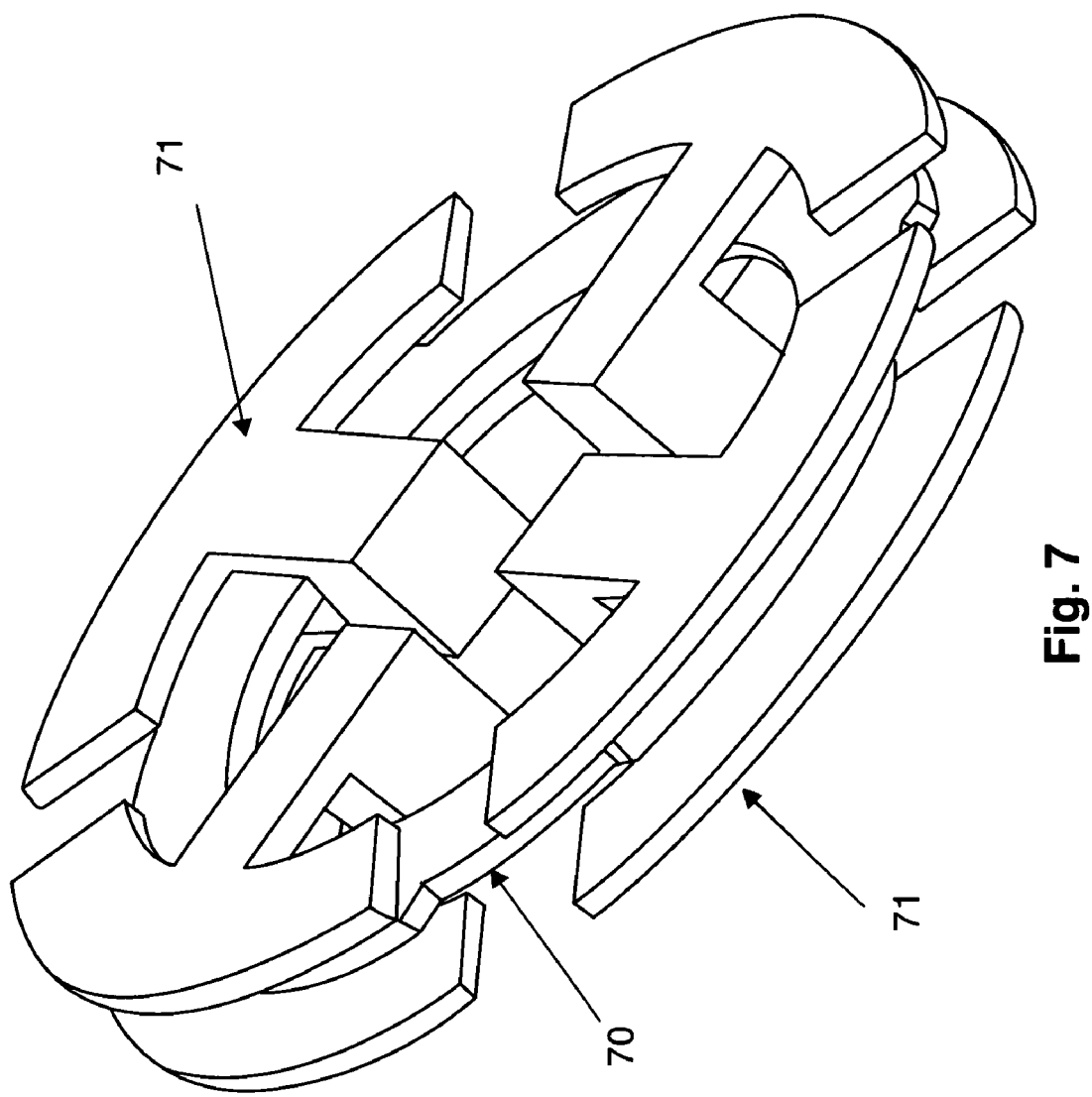
FIG. 7 depicts in schematic perspective view the rotor and stators of a FLEMS flux capacitor.
Figure 9:
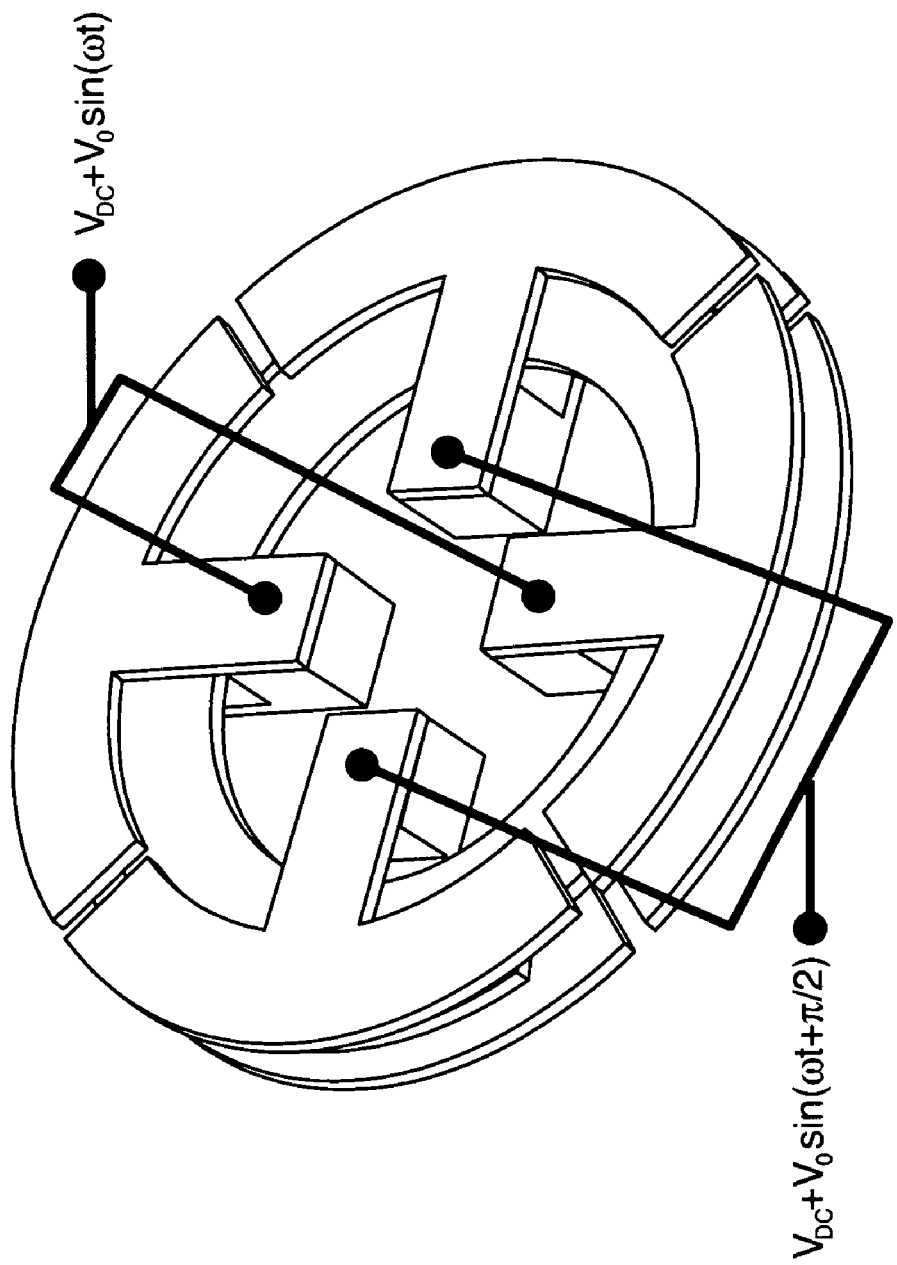
FIG. 9 depicts in schematic perspective view a FLEMS flux capacitor as in FIG. 7 including typical drive voltages applied to the stators.
Figure 10:
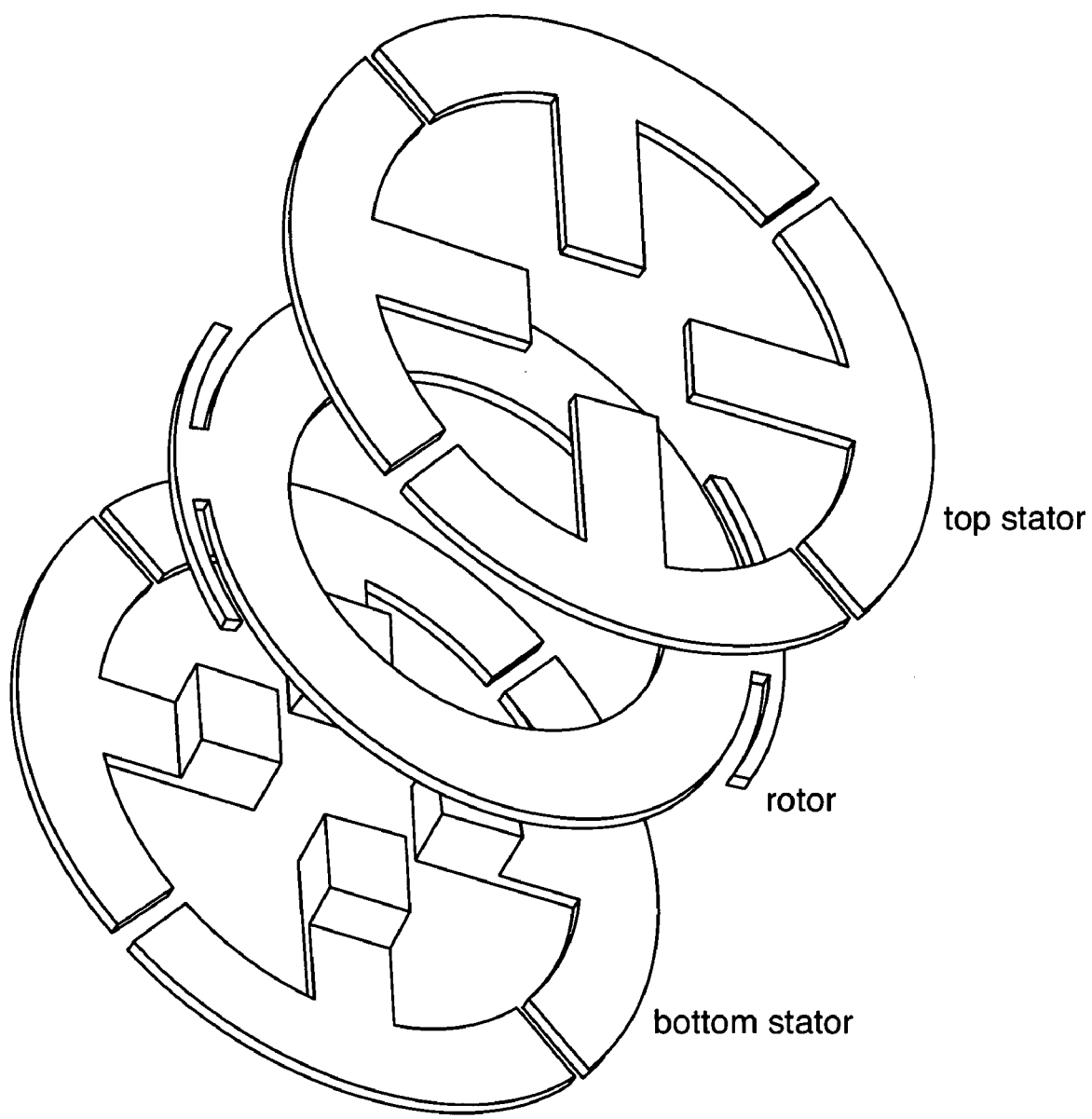
FIG. 10 depicts an exploded view of the rotor and stators of a FLEMS flux capacitor as in FIG. 7.

FIG. 7 depicts a typical FLEMS flux capacitor pursuant to some embodiments of the present invention in which a floating rotor 70 is charged by any, or any combination, of means disclosed herein or otherwise known, and located between two stationary stators, 71. At least one and typically both stators are charged. By rotating the rotor 70 with respect to the stators 71, magnetic flux is generated as a magnetic or B-field as depicted in FIG. 8a (top view) and FIG. 8b (side view). The geometry of the stators shown in FIGS. 7, 8 and 9, in combination with the time-varying voltages applied to the stators as depicted in FIG. 9 causes rotor 70 to attain angular velocity ω. FIG. 10 shows the flux capacitor of FIG. 7 in exploded view as it might be fabricated by a three-mask fabrication process.

6. FLEMS SQUID-Gyro

Figure 11:
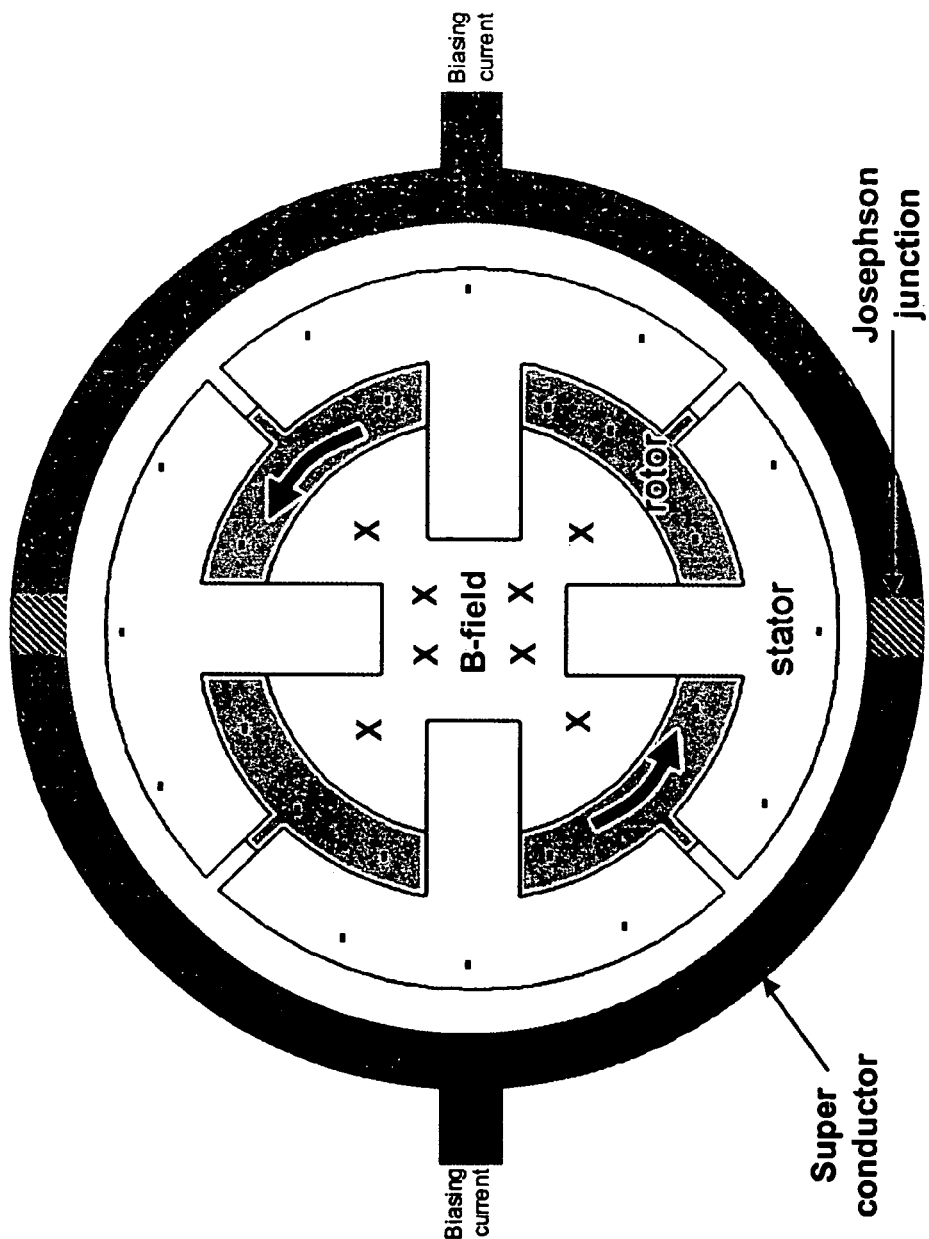
FIG. 11 depicts in top view, a schematic diagram of a FLEMS flux capacitor in combination with a SQUID to form a sensitive gyro.

A two-junction Superconducting Quantum Interference Device (SQUID), or DC SQUID, consists essentially of two superconductors separated by two thin, insulating layers forming a pair of Josephson junctions, as depicted in FIG. 11. Among other uses, SQUIDs can be employed as very sensitive detectors of magnetic flux and changes in magnetic flux passing through the ring enclosed by the superconductors and Josephson junctions ("the SQUID ring"). By using a FLEMS flux capacitor surrounded by a SQUID ring, quantum changes in the magnetic field generated by the spinning flux capacitor are sensed by the SQUID. Since the magnetic flux depends on the angular momentum of the rotating mass, changes in the magnetic flux sensed by the SQUID yields a very sensitive gyro.

Figure 12A:
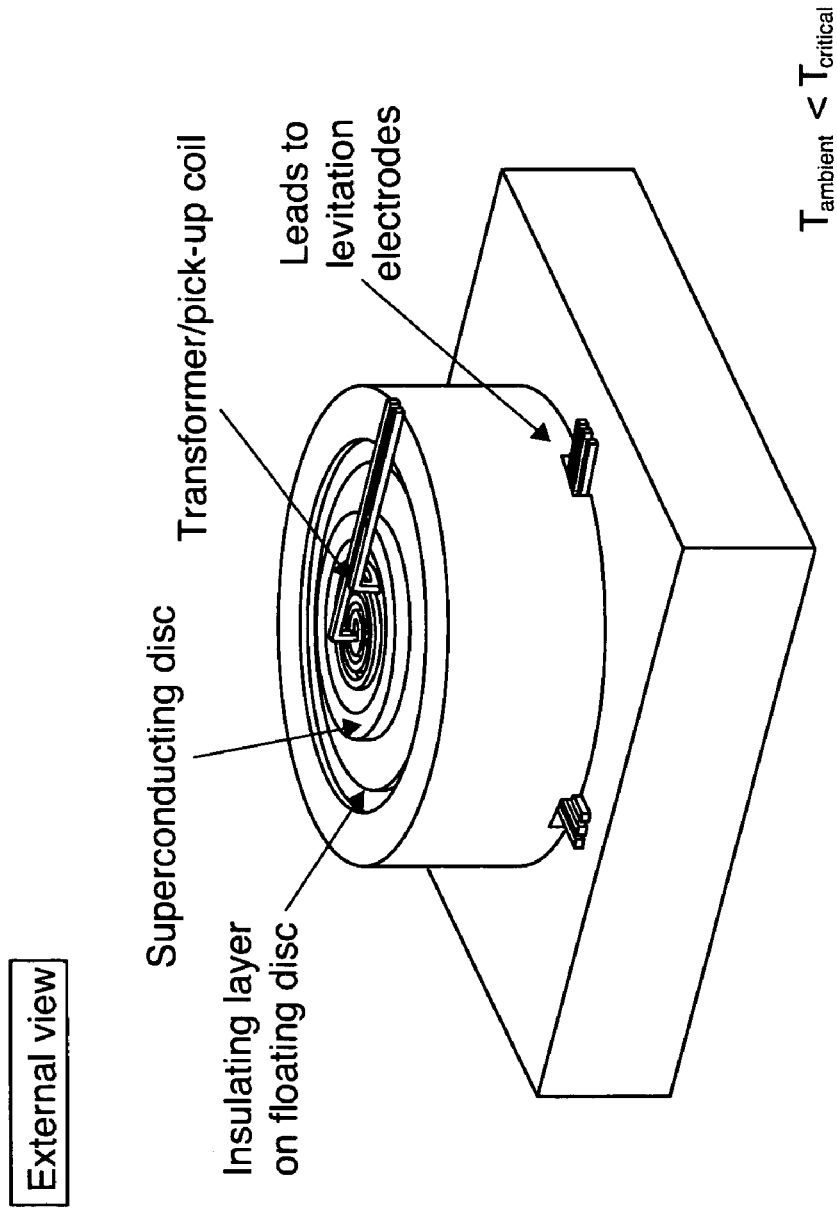
FIG. 12 depicts in schematic perspective view (12a) and schematic cut-away views (12b and 12c) another configuration for a FLEMS/SQUID device.
Figure 12B:
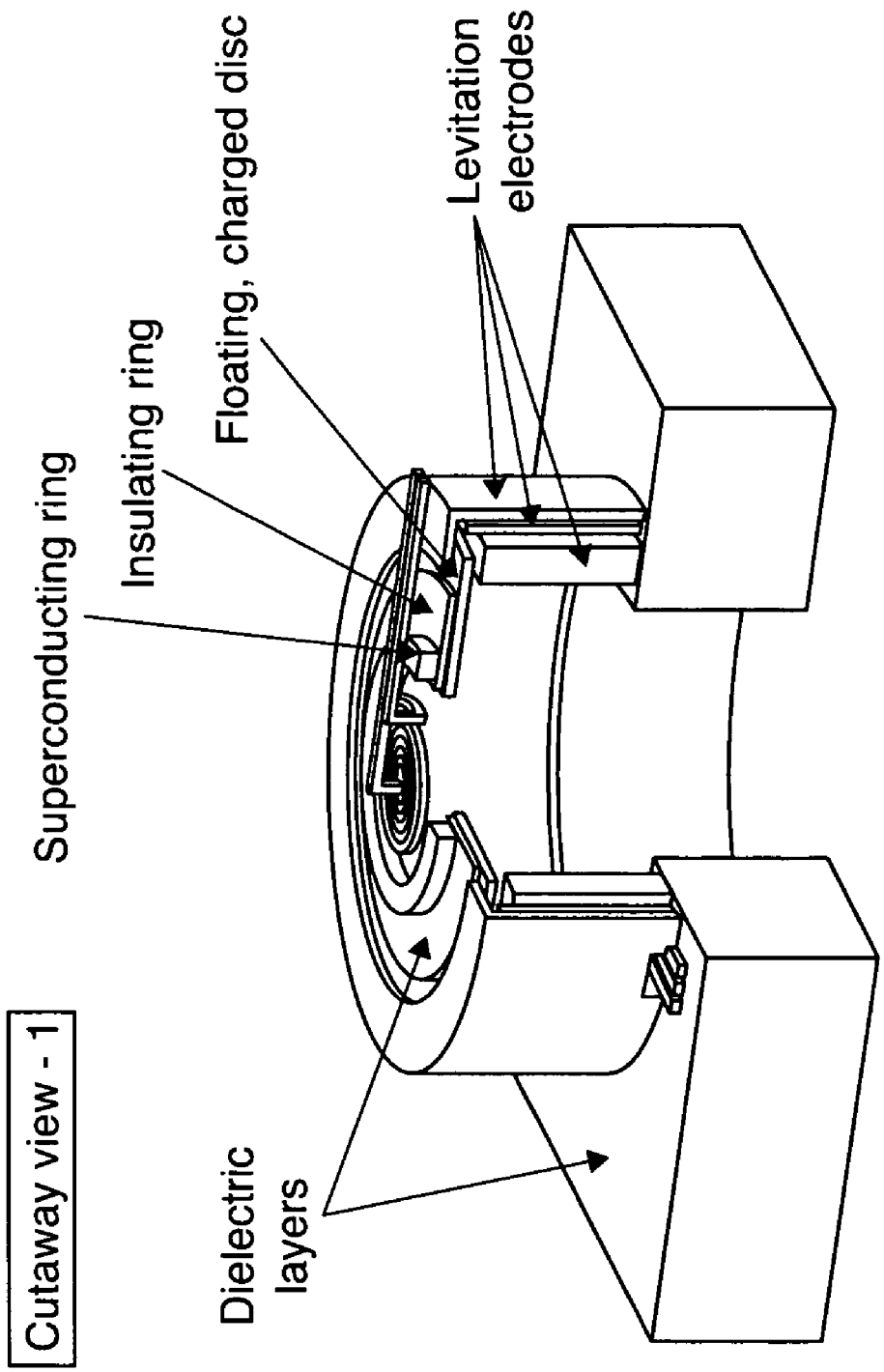
Figure 12C:
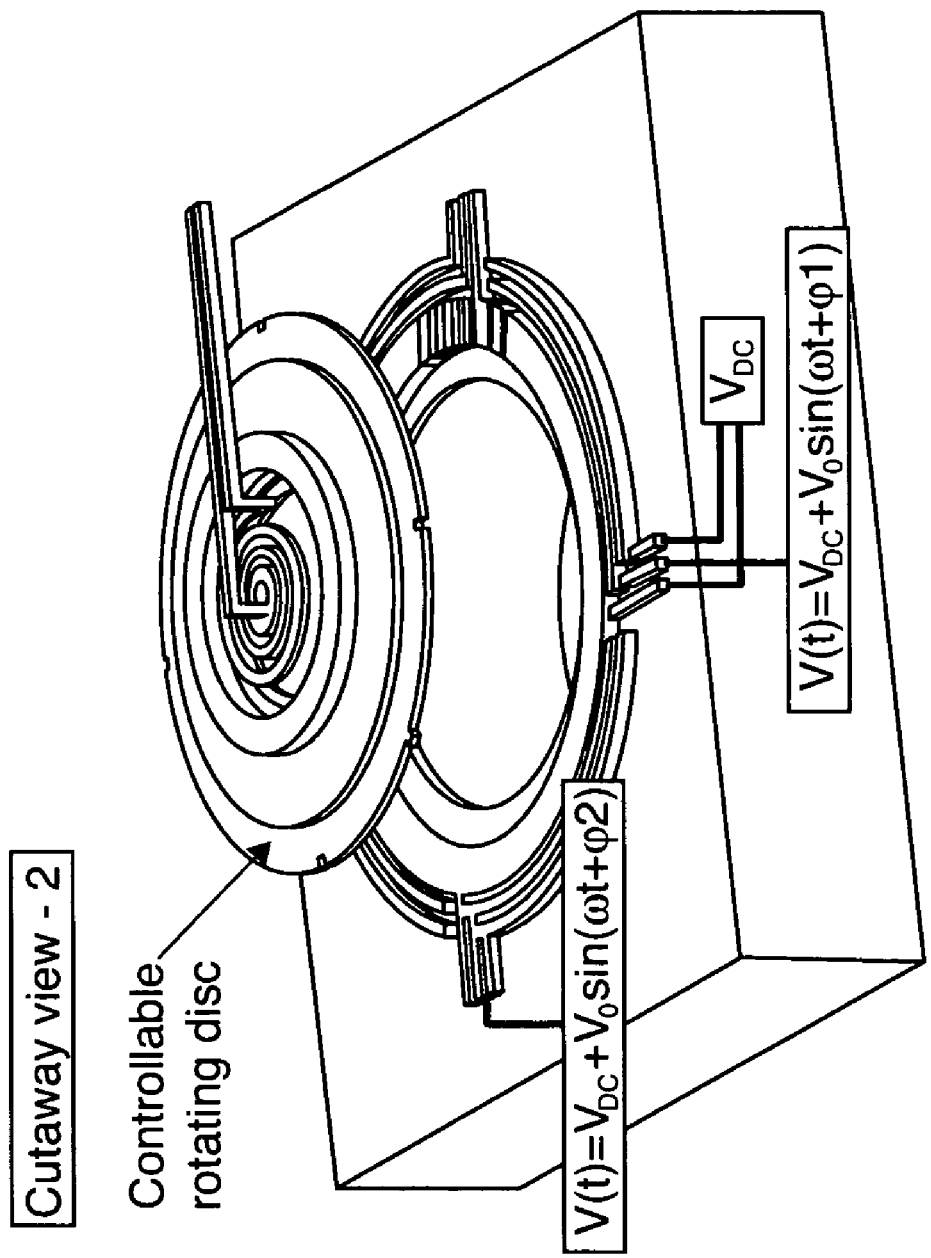

An alternative embodiment of a FLEMS/SQUID device is given in perspective view FIG. 12a, cut-away view in FIG. 12b and cut-away view including typical driving voltages in FIG. 12c. Thus, FIG. 12 depicts an alternative embodiment for a flux capacitor that can be coupled with a SQUID to produce a sensitive gyro.

Various approaches can be used for the functional combination of a FLEMS device and a SQUID. For example, the device can initially be placed in an external magnetic field. When the external field is removed, a magnetic field inside the SQUID ring is "trapped." During operation, the rotating FLEMS disc adds to the magnetic flux. Quantum changes in the magnetic flux due to changes in the rotation of the FLEMS device can be measured with the pickup coil.

Although various embodiments which incorporate the teachings of the present invention have been shown and described in detail herein, those skilled in the art can readily devise many other varied embodiments that still incorporate these teachings.

What is claimed is:

1. A floating MEMS device comprising:
   a) an electrostatically charged proof mass; and,
   b) at least two stabilizing electrode structures carrying charges that repel the electrostatic charges on said proof mass, wherein
      i) said proof mass is located with respect to said stabilizing electrode structures so as to levitate due to like-charge repulsion between said proof mass and said stabilizing electrode structures; and wherein
      ii) said proof mass and said stabilizing electrode structures are located so as to produce electrostatic repulsion leading to stable levitation such that displacements of said proof mass from its equilibrium floating position result in electrostatic forces on said proof mass tending to return said proof mass to said equilibrium position; and
   further comprising a plurality of side electrodes disposed about the periphery of said proof mass, having first ends of said side electrodes integrally attached to said proof mass and having the opposite, second ends of said side electrodes projecting outward from said proof mass, and wherein said side electrodes carry at least a portion of said electrostatic charge of said proof mass, and wherein each of said second ends of said side electrodes project into one of said stabilizing electrode structures.

2. A floating MEMS device as in claim 1 wherein said side electrodes have termination blocks on said second ends thereof.

3. A floating MEMS device as in claim 2 wherein each of said stabilizing electrode structures comprise five blocks interacting electrostatically with said termination block of said side electrode.

4. A floating MEMS device as in claim 1 further comprising at least one sensor for detecting the position of said proof mass.

5. A floating MEMS device as in claim 4 wherein said at least one sensor comprises at least one device for measuring the electrical properties of at least one of said stabilizing electrode structures during operation of said MEMS device.

6. A floating MEMS device as in claim 4 wherein said at least one sensor comprises at least one sensing electrode located in proximity to said proof mass.

7. A floating MEMS device as in claim 1 further comprising at least one drive electrode located so as to apply force to said proof mass under external control.

* * * * *